US008548774B2

(12) United States Patent
McLuckie

(10) Patent No.: US 8,548,774 B2
(45) Date of Patent: Oct. 1, 2013

(54) SIMULATION ENVIRONMENT FOR SIMULATING PHYSICAL SYSTEM AND/OR SUB-SYSTEMS

(75) Inventor: Ian Reginald Walter McLuckie, Leicestershire (GB)

(73) Assignee: Advanced Integrated Engineering Solutions Ltd, Leicestershire (GB)

( * ) Notice: Subject to any disclaimer, the term of this patent is extended or adjusted under 35 U.S.C. 154(b) by 470 days.

(21) Appl. No.: 11/914,931

(22) PCT Filed: May 18, 2006

(86) PCT No.: PCT/GB2006/001824
§ 371 (c)(1),
(2), (4) Date: Jun. 27, 2008

(87) PCT Pub. No.: WO2006/123149
PCT Pub. Date: Nov. 23, 2006

(65) Prior Publication Data
US 2008/0312880 A1 Dec. 18, 2008

(30) Foreign Application Priority Data

May 18, 2005 (GB) .................................. 0510108.4

(51) Int. Cl.
*G06F 17/50* (2006.01)
*G06G 7/48* (2006.01)
(52) U.S. Cl.
USPC ...................................... 703/1; 703/7; 703/8

(58) Field of Classification Search
USPC ..................................................... 703/1, 7, 8
See application file for complete search history.

(56) References Cited

U.S. PATENT DOCUMENTS

| 5,561,748 | A   | * | 10/1996 | Niu et al. ....................... 345/420 |
| 6,099,573 | A   | * | 8/2000  | Xavier ............................... 703/7 |
| 6,131,097 | A   | * | 10/2000 | Peurach et al. ....................... 1/1 |
| 6,232,983 | B1  | * | 5/2001  | Felser et al. ................... 345/649 |
| 6,477,438 | B1  | * | 11/2002 | Sakai et al. ..................... 700/97 |
| 6,560,570 | B1  |   | 5/2003  | Dohrmann et al. |
| 6,792,398 | B1  | * | 9/2004  | Handley et al. ................... 703/2 |
| 6,904,395 | B1  | * | 6/2005  | DeJack et al. ..................... 703/7 |
| 2002/0083076 | A1 | * | 6/2002 | Wucherer et al. ............. 707/102 |
| 2003/0149500 | A1 |   | 8/2003 | Faruque et al. |
| 2004/0153296 | A1 | * | 8/2004 | Landers et al. ................... 703/2 |
| 2004/0210429 | A1 |   | 10/2004 | Yu et al. |

FOREIGN PATENT DOCUMENTS

EP          0881585 A1     12/1998

\* cited by examiner

*Primary Examiner* — Nithya Moll
(74) *Attorney, Agent, or Firm* — Fulwider Patton LLP

(57) ABSTRACT

A simulation environment for simulating a physical system or sub-system. The environment includes a plurality of elements that can be arranged to form any of a number of component objects or sub-component objects. The component or sub-component objects are assembled to form at least one assembly object that forms at least part of the system or sub-system. Each element is provided with mesh data, and rules of connectivity. The rules of connectivity govern the interconnection of the elements to form the component or sub-component objects. The mesh data for a particular element is automatically incorporated into each completed component or sub-component object that includes that particular element.

16 Claims, 29 Drawing Sheets

| Angle Object Geometric Attributes |||| 
|---|---|---|---|
| Dim | Geometric Attributes | Value | Units |
| 1 | Length | | mm |
| 2 | Width | | mm |
| 3 | Thickness y | | mm |
| 4 | Thickness x | | mm |
| 5 | Depth z | | mm |

*Fig 4(a)*

| Angle Object Material/Physical Attributes ||||
|---|---|---|---|
| Dim | Material attributes | Value | Units |
| 1 | Density | | Kg/m$^3$ |
| 2 | Young's Modulus | | MPa |
| 3 | Poissons ratio | | ratio |
| 4 | Thermal conductivity | | 1/C° |
| 5 | Endurance limit | | MPa |
| 6 | Etc. | | |

*Fig 4(b)*

| Angle Object Derived Attributes |||||
|---|---|---|---|
| Dim | Derived Attributes | Value | Units |
| 1 | Mass | | Kg |
| 2 | Stiffness XX | | N/mm |
| 3 | Stiffness YY | | N/mm |
| 4 | Second Moment of Area XX | | mm$^4$ |
| 5 | Second Moment of Area YY | | mm$^4$ |
| 6 | Polar moment of Inertia XX | | kgm$^2$ |
| 7 | Polar moment of Inertia YY | | kgm$^2$ |
| 8 | Etc. | | |

*Fig 4(c)*

| Lubricant/Fluid Object Attributes |||||
|---|---|---|---|
| Dim | Lubricant Attributes | VALUE | Units |
| 1 | Viscosity (cSt) @ 40C° | | NS/m |
| 2 | Viscosity (cSt) @ 100C° | | NS/m |
| 3 | Density @ Temp 40C° | | Kg/m$^3$ |
| 4 | Specific heat | | J/kg/C° |
| 5 | Thermal conductivity | | W/m/C° |
| 6 | Thermal Expansivity | | 1/C° |
| 7 | Pressure viscosity coefficient | | kgm$^2$ |
| 8 | Eyring Shear Stress | | MPa |
| 9 | Limiting Shear Stress | | MPa |
| 10 | Rate of change of shear/pres | | |

*Fig 4(d)*

EngineDrive
└──→ CamDrive
└──→ CylDrive
└──→ CrankDrive
└──→ LubeDrive.
└──→ AuxDrive

*Fig 18(a)*

CylDrive
└──→ Block1
└──→ Liner1
└──→ Powercyl1
└──→ Liner2
└──→ Powercyl2
└──→ Liner3
└──→ Powercyl4
      └──→ Piston4
      └──→ Pin4
      └──→ Topring4
      └──→ Secondring4
      └──→ Oilring4
      └──→ Conrod4
            └──→ Smallendbrg4
            └──→ Bigendbrg4
            └──→ Boltlhs4
            └──→ Boltrhs4

*Fig 18(b)*

CrankDrive

AuxDrive

→ GenDrive
→ TurboDrive
→ PumpDrive
→ E-Boost
→ Cooling Fan
→ Etc

LubeDrive

- → PumpDrive
- → Engine Loading
- → Oil Flow Paths
- → Piston oil cooling
- → Fluid Inertia loading
- → Etc

_Fig 18(f)_

Vehicle System
└──▶ EngineDesigner
└──▶ GenDesigner
└──▶ TurboDesigner
└──▶ TransmissionDesigner
└──▶ ChassisDesigner
└──▶ BrakeDesigner
└──▶ Etc

*Fig 20(c)*

GenDesigner
└──▶ RotorSystemDrive
└──▶ StatorSystemDrive
└──▶ BearingSystemDrive
└──▶ AuxiliarySystemDrive
└──▶ Etc.

*Fig 20(d)*

RotorSystemDrive
- → RotorCore
- → RotorWinding
- → Shaft
- → Etc

*Fig 20(e)*

StatorSystemDrive
- → StatorCore
- → StatorWinding
- → StatorFrame
- → Etc

*Fig 20(f)*

AuxillarySysemDrive
- → FanDrive
- → ExciterDrive
- → Etc

*Fig 20(g)*

BearingSystemDrive
- → BearingObjects
- → LubricationSystem
    Etc

*Fig 20(h)*

SIMULATION ENVIRONMENT FOR SIMULATING PHYSICAL SYSTEM AND/OR SUB-SYSTEMS

RELATED APPLICATIONS

This is a U.S. national phase application of PCT/US2006/001824, filed May 18, 2006, which claims priority from United Kingdom Application No. 0510108.4 filed May 18, 2005.

The present invention relates to a simulation environment, and in particular a simulation environment suitable for simulating physical systems and/or sub-systems including rotating machinery and engines such as those used in the aerospace, automotive, and power generation industries.

Developers of rotating machinery and engines for power generation, aerospace, transportation, automotive industries and the like are under ever increasing pressure to take account of environmental issues in the design of new products. World governing bodies increasingly require environmental concerns such as global warming and renewable energy issues to be taken into account during the development process, in order to produce 'greener' solutions with reduced emissions, improved fuel consumption, lower friction (losses) etc.

Furthermore, product life cycles have reduced dramatically (typically from 48 to 24 months), to keep up with the world economic policy decisions, and to meet the aspirations of a products' end users. For example, vehicles and engines are now being upgraded within the product life cycle a number of times before the product is replaced by a completely new design. This is to ensure customer interest in the product for the length of its life.

Hence, senior engineering management are under increasing pressure to find new ways of achieving aggressive development targets, whilst at the same time improving product reliability and reducing costs.

Computer Aided Design (CAD), and Computer Aided Engineering (CAE) techniques involving Finite Element Analysis (FEA) and Computational Fluid Dynamics (CFD) analysis, has long been used to assist in reducing development cycles by allowing engineers and designers to simulate new products and to analyse their performance before prototypes are manufactured and tested. However, currently the CAD-CAE route has failed to achieve its potential, primarily because CAD-CAE tools currently available do not fully encapsulate design intent and methodology.

The issues with such tools are particularly evident when CAD and FEA are applied to large-scale structures such as, for example, engine cylinder heads and blocks, where a good quality hexahedral mesh is required for analysis purposes.

For such complex, large-scale simulations, meshing alone can take several weeks or even months. Hence, the currently available CAD-CAE design analysis routes can, at best, capture a one shot analyses within the time scales imposed by aggressive development cycles. Thus, significant structural optimisation cannot be undertaken, and changes decided after meshing has begun cannot be incorporated into the analysis. These issues are further compounded by frequent difficulties in convergence of a particular model to a suitable solution, and issues of bad CAD geometry and the need for subsequent repair.

Another issue associated with current CAD-CAE products is a lack of integration. Designers tend to use dedicated CAD tools, whilst analysts use FEA or CFD analysis applications. This leads to a need for communication between the products using a CAD translator or the like.

The present invention seeks to provide an improved simulation environment, which mitigates at least some of the above issues.

According to a first aspect of the invention there is provided a simulation environment as claimed in claim 1.

The simulation environment may preferably include any of the features recited in the dependent claims.

Preferably the mesh incorporated into the component or sub-component object is substantially continuous and an attribute or part of a solid model. The solid model may be an object assembled from other objects, for example, a component object, a sub-system object or a sub-system object.

The invention will now be described by way of example only with reference to the attached figures in which:

FIG. 4(*a*) is a geometric attribute table for an object;

FIG. 4(*b*) is a material/physical attribute table for an object;

FIG. 4(*c*) is a derived attribute table for an object;

FIG. 4(*d*) is liquid/fluid attribute table for a tribological object;

Figure 1:
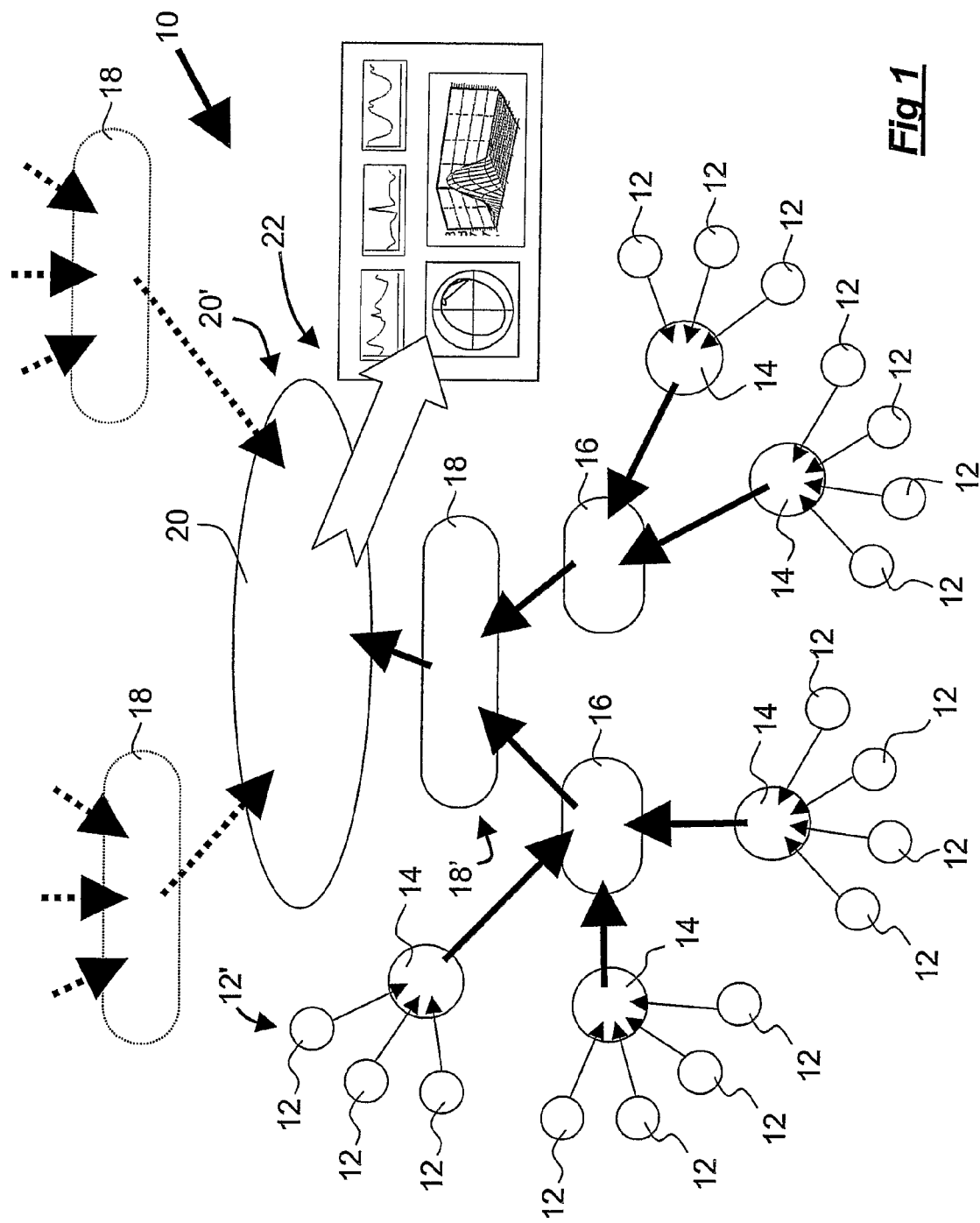
FIG. 1 is a simplified schematic block diagram illustrating a simulation environment according to the invention.
Figure 19A:
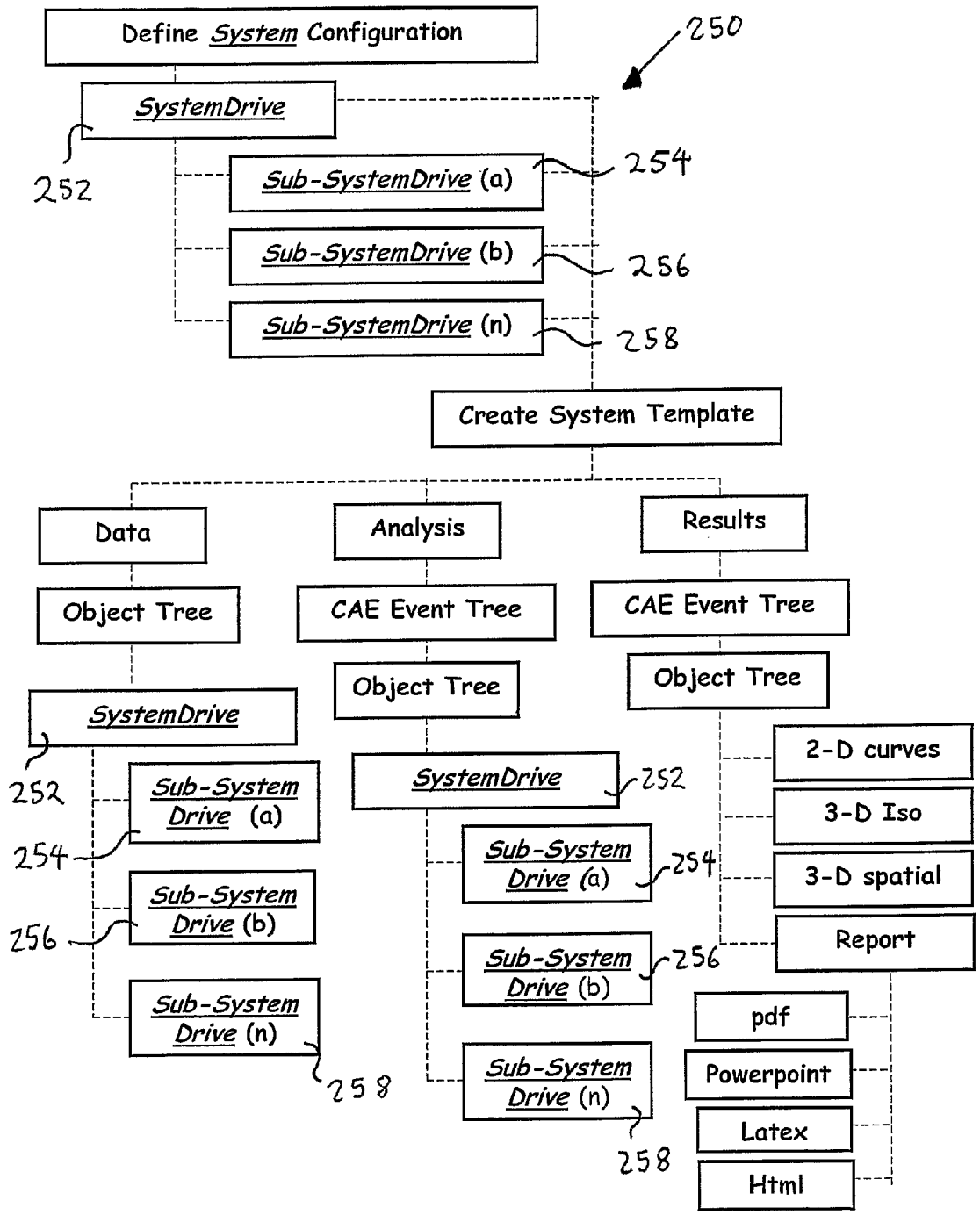
Figure 19B:
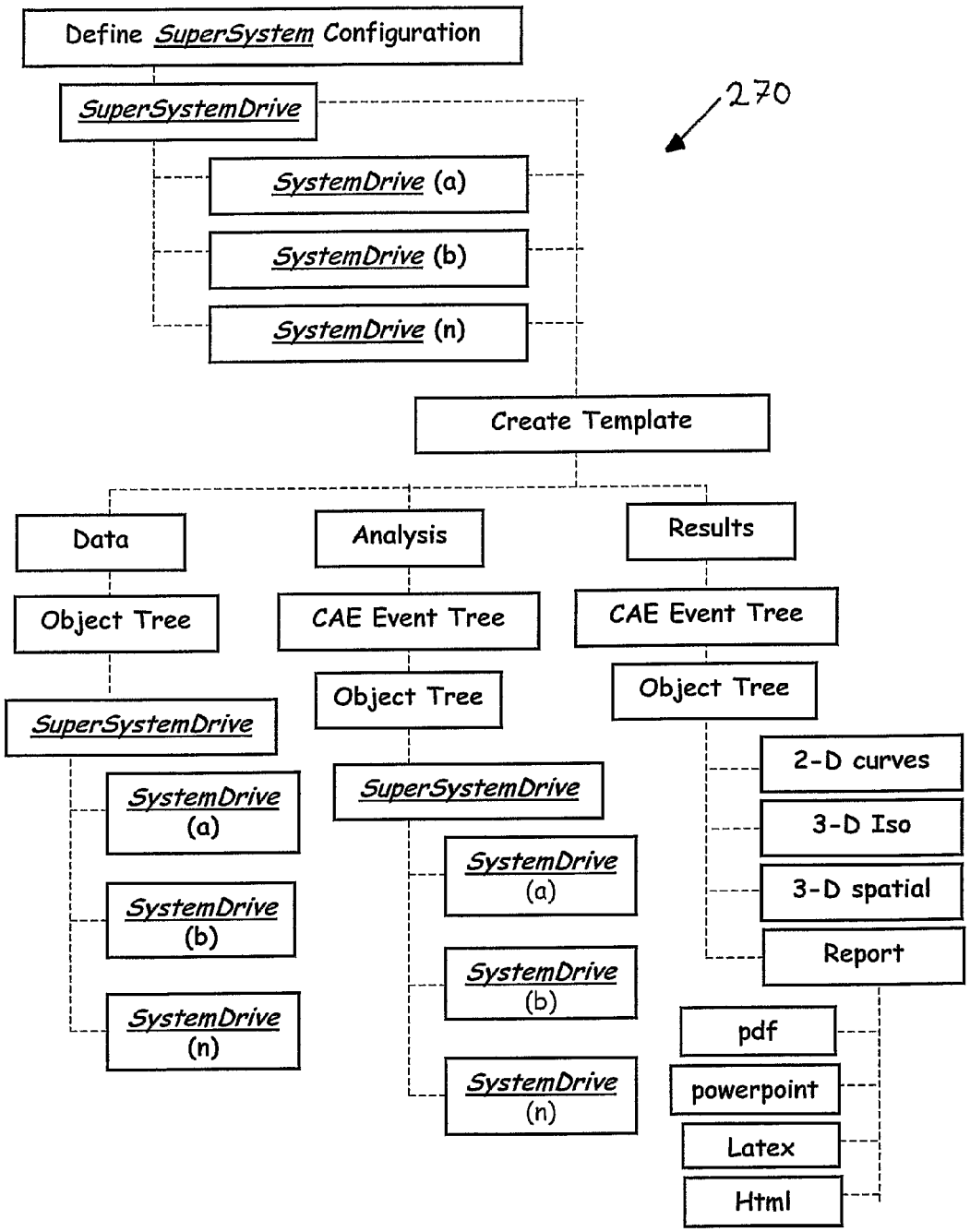
Figure 20A:
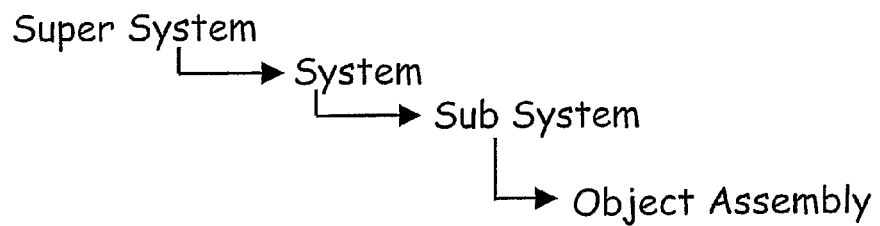

FIGS. 17(*b*) to (*d*) illustrate respectively, a portion of: an engine configuration object tree; an engine analysis object tree; and an engine results object tree; each forming part of the template maker object tree;

FIG. 17(*e*) illustrates a portion of a computer-aided engineering event (CAE) object tree which forms part of the engine analysis and engine results object trees;

FIG. 18(a) illustrates a portion of an object tree for an engine system;

FIGS. 18(b) to (f) each illustrates a portion of a different object assembly object tree for sub-systems of the engine system;

FIG. 19(a) is a schematic block diagram of a generic system designer framework;

FIG. 19(b) is a schematic block diagram of a generic super-system designer framework FIGS. 20(a) and (b) each illustrate a portion of an object tree for a super-system;

FIG. 20(c) illustrates a portion of an object tree for a vehicle system;

FIG. 20(d) illustrates a portion of an object tree for a generator system/sub-system of the vehicle system;

FIGS. 20(e) to (h) each illustrates a portion of a different object assembly object tree for sub-systems of the generator system/sub-system;

In FIG. 1 a simplified schematic block diagram providing an overview of a design, simulation and analysis system, or simulation environment, is shown generally at 10.

Throughout the description reference will be made, in particular, to the example of engine development. It will be appreciated, however, that the simulation environment 10 also has application for modelling other physical systems including more complex systems, entire vehicles, power generation plants or the like. The environment 10 may also be used for the simulation of 'distributed' systems or super-systems comprising a plurality of vehicles and/or other physical systems of different types.

The environment 10 is implemented as a knowledge based object oriented design (OOD) system, which allows models of complex physical systems, such as mechanical systems and sub-systems including rotating machinery and engines, to be built up in a hierarchical fashion of from a library of relatively simple 2D and/or 3D elements 12 known as finite objects. In operation, once a model of a particular system or subsystem has been constructed, the environment allows the simulation and analysis of the model without the need for time consuming meshing and re-meshing.

The environment comprises a plurality of object levels 12', 14', 16', 18', 20', each representing a different level of abstraction. It will be appreciated that although a specific number of abstraction levels are described and shown there may be any suitable number of levels of abstraction.

The elements 12 represent the least complex objects and hence form the highest level of abstraction 12'. In operation, the elements 12 are assembled into component or sub-component objects 14. Typical components, for example, might include shaft objects, keyed shaft objects, journal objects, crank pin objects, or any other physical object.

The components or sub-components 14 are, in turn, assembled into object assemblies or sub-assemblies 16 representing more complex components, systems or sub-systems, at a lower level of abstraction 16'. Typical assemblies or sub-assemblies, for example, might include crankshaft assembly objects, cylinder head objects, cylinder block objects, valve assembly objects or any other object assemblies representing physical systems or sub-systems. Similarly, the object assemblies or sub-assemblies are assembled into more complex object assemblies 18 at an even lower object level 18' for example in nanotechnology and MEMS applications. A typical more complex assembly, for example, might represent a valve train assembly.

This assembly process continues through the hierarchical levels until the desired system object has been completely assembled for subsequent simulation and analysis. A typical assembled system, for example, might represent an engine for a vehicle or the like.

It will be appreciated that each object need not be assembled from objects from only a single level of the hierarchy, but may comprise a plurality of objects of varying complexity from different hierarchical levels. Furthermore, an assembled system object may be subsequently assembled into a more complex system object. For example, an engine system object also represents a sub-system of a vehicle, and as such may be assembled with other objects representing the sub-systems of a vehicle such as transmission, chassis, brakes, generator etc. to form a vehicle object which may be simulated and analysed accordingly.

In addition to the library of finite objects 12, the environment 10 is also provided with a plurality of pre-assembled objects, each representing a common system, sub-system, or component or configuration. For example, an engine developer system may be provided with a plurality of system and/or sub-system objects representing common engine configurations such as, V-configuration, inline 'I' configuration or the like. Similarly, for each engine configuration, system objects may be provided for typical design options such as number of cylinders (e.g. V2 to V16, I1 to I12), number of valves per cylinder, fuel type (e.g. gasoline, diesel, alternative fuel) and engine type (e.g. racing).

A system designer or engineer may therefore use the pre-assembled objects as the basis for new developments rather than design a new system from scratch. Similarly, any newly designed system or other objects, form part of the object library and are therefore available for future development projects and or reuse.

The simulation environment 10 also provides a range of simulation, analysis, and data result presentation tools 22 for simulating and analysing each system and/or sub-system represented by each assembled system object. The tools 22 may comprise any suitable simulation and analysis means in dependence on the nature of the system being simulated and the physical processes requiring analysis. For example, typical engine analysis tools include a plurality of mathematical, multi-physics based models for: fuel injection simulation; combustion simulation; cycle simulation; load analysis; heat transfer and cooling; thermo-mechanical stress analysis; tribology friction and lubrication; structural dynamics Multi body dynamics (MBD) and Noises Vibration and Harshness (NVH); durability; and the like.

The tools are grouped by analysis event (CAE event). The main CAE events that take place for an engine system (neglecting manufacturing and assembly processes), for example, include: fuel injection; combustion simulation; cycle simulation; heat transfer and cooling; thermal stress analysis; lubrication and friction; structural dynamics and NVH; and durability.

Hence, each system and sub-system can be accurately simulated using an entire range of physical models. Friction analysis for a valve train in the engine, for example, might include analysis of Hertz contact stresses, cam to tappet contact temperatures, film thickness ratio in the cam to tappet contact, cam lobe contact zone, tappet contact zone with wear track, and the cam to tappet friction force over the engine cycle etc.

Figure 2:
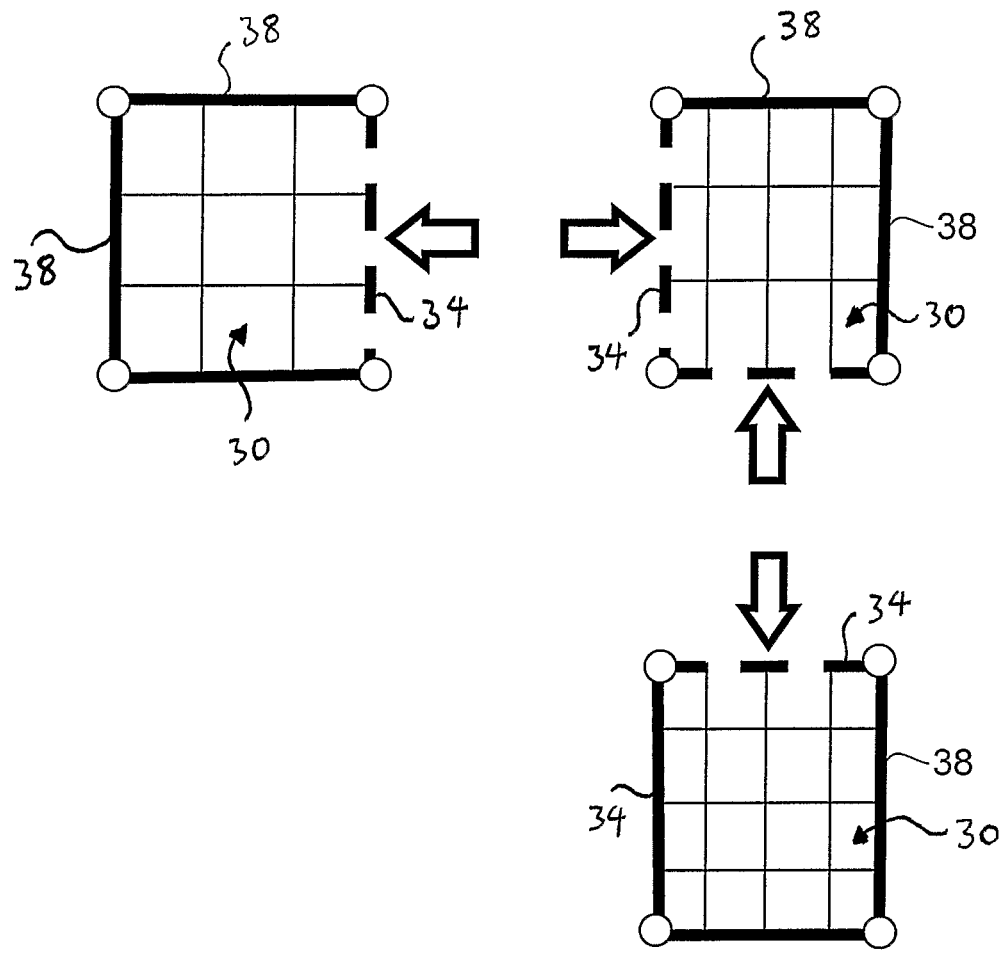
FIG. 2 is a diagram illustrating the interconnection of a plurality of 2-D finite objects.
Figure 3:
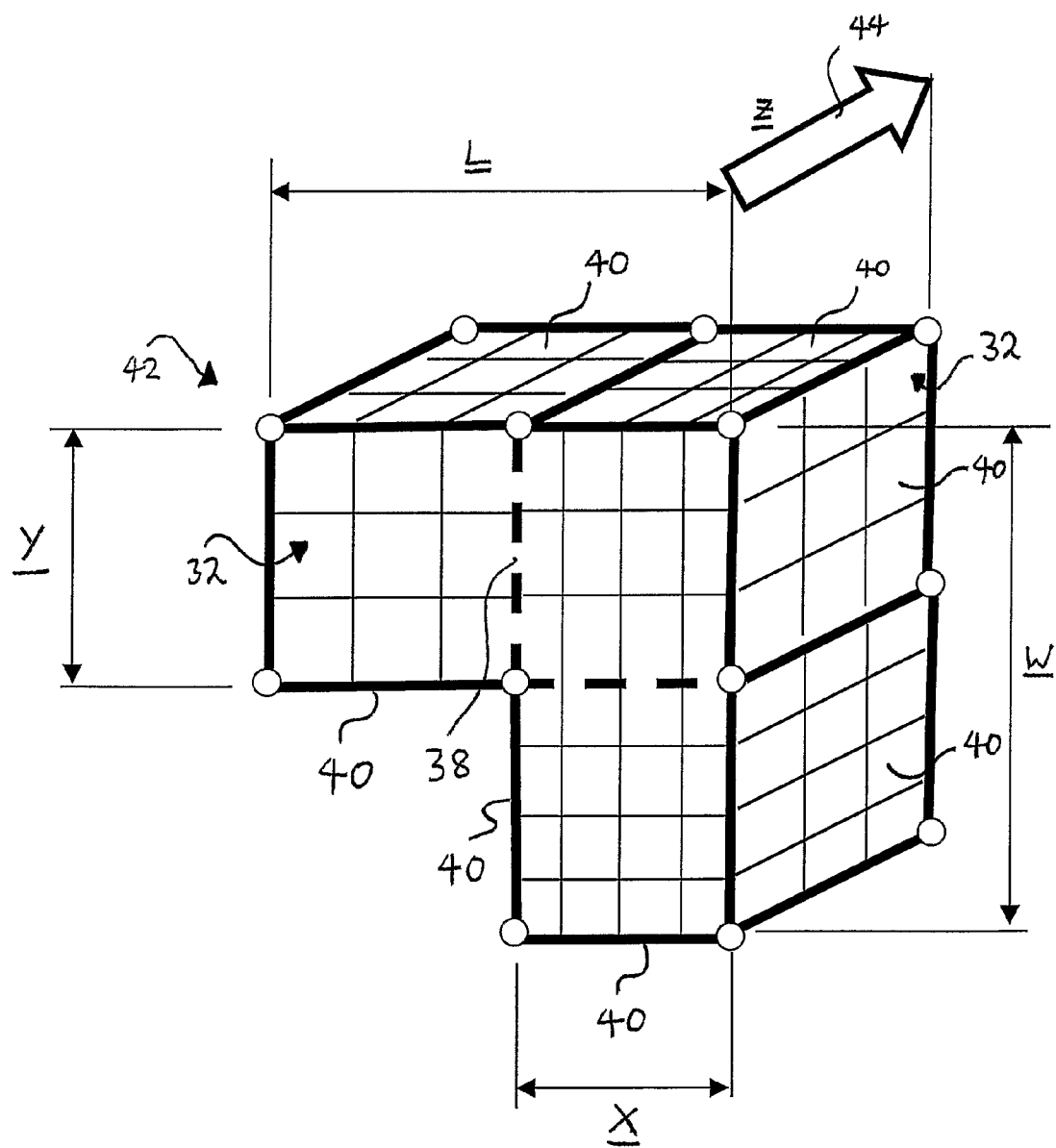
FIG. 3 is a diagram showing a 3-D object formed from a plurality of 2-D finite objects.

Referring now to FIGS. 2 and 3, the elements 12 comprise both 2D and 3D finite objects 30, 32, located in a library, each of which is provided with an associated integrated hex finite elements mesh template. It will be appreciated that although a finite elements mesh is described each mesh template may alternatively or additionally include boundary elements, finite volumes, and/or finite differences mesh data.

Thus, each element carries its own associated mesh data, which may be 1D, 2D, or 3D. The mesh data comprises the geometric and mathematical data required for the mathematical and geometric representation of each element 12, and ultimately an object assembled from the elements 12. Furthermore, the mesh data is refinable thereby allowing the plurality of points, nodes, and elements, along the sides or on the surfaces of the elements 12 to be modified and enhanced. The elements 12 and the associated mesh data are also scaleable allowing the finite objects 12 to be manipulated for assembly into a variety of more complex objects of different shapes and sizes.

The 2D finite objects 30 are of different geometric shapes, which may be assembled together to form shapes of greater complexity. The shapes are chosen to capture appropriate hex meashable qualities, such that when a 2D element 30 is manipulated, for example, by scaling or by modifying a geometric attribute of an object including the element, the changes are automatically incorporated into the finite element mesh.

The 3D elements 32 are generated from geometric transformations applied to the 2D elements, or assemblies of them. Typical transformations include, for example, revolution, extrusion, sweep etc.

The sides of the 2D elements 30 and the surfaces of the 3D elements 32, including those with apparently straight sides (2D) or planar surfaces (3D), are provided with a radius of curvature thereby allowing greater manipulation versatility. For example, the apparently straight sides of the quadrilateral 2D elements 30 seen in FIG. 2 are represented by 'curves' of radius tending to the infinite. Thus, in operation, a simple manipulation of the radius results in a curved side and an associated change to the mesh data.

It will be appreciated that more versatility may be provided by representing the sides or surfaces using a more complicated mathematical algorithm, such as, for example, the sum of a Fourier series or the like, thereby allowing more complex manipulations to be made to the sides or surfaces without the need for extensive redesign and mesh re-construction.

The basic elements 12 comprise connectivity sides 34 (2D) or surfaces 36 (3D) via which the elements 30 are interconnected to form a closed shape or object. Similarly, the elements 12 comprise interface sides 38 (2D) or surfaces 40 (3D), which form the boundary edge or outer surface of an assembled object, and allow assembled objects to be interconnected to form objects of greater complexity.

The internal connections between the objects, at the connectivity sides/surfaces, are configured to allow geometric and mesh information to be passed from one object and hence element to another and hence allow changes to the geometry and material attributes of an object and/or changes to the elements within the mesh to be automatically propagated throughout the assembled object. The internal connections remain private (or hidden) when a more complex object is being assembled from finite objects or finite object assemblys Contrastingly, when a finite object assembly is being constructed from the base finite objects 38, 40, the connections are publicly available, thereby allowing objects to be assembled with relative ease.

The interface sides 38 or surfaces 40 are used for the interconnection of assembled component objects, via special interface objects. Interface objects may comprise any suitable object configured with appropriate interface properties and may include, for example, bearing objects, support objects, contact objects, and/or fluid film objects. For instance, a shaft journal object may be interfaced to a bearing housing object via a bearing oil film object.

It can be seen, therefore, that a finite object may comprise any number of sides or surfaces defining the basic shape of the object. The sides may be used either as a connectivity side/surface or an interface side/surface according to the nature of the object being defined. For example, a basic 2D rectangular element having four sides may be extruded, using an appropriate transformation, to form a 3D elongated cuboid element having six surfaces, comprising four side surfaces, and two end surfaces.

If the cuboid element were used to define a component object comprising a rectangular cross-section beam, all six surfaces would be defined as interfaces, the length, width and height of the beam being defined using appropriate geometric attributes. Alternatively, if the cuboid element were used as the centre portion of a cylindrical component object representing a shaft or the like, the four side surfaces may be 'internal' connection surfaces, the two end surfaces forming part of the interface surfaces at each end of the shaft.

The geometry of each interface surface, and hence the assembled object, is governed by a set of geometric attributes associated with the assembled object. The attributes are object specific and include all the information necessary for defining the object. A simple shaft for an engine, for example, may be formed from a single 3D cylindrical finite object assembly, which has been extruded from a 2D circular finite object assembly. The shaft object may thus be defined by just two attributes: length which defines the extent of the extrusion; and diameter, which defines the scaling applied to the circular object. Hence, modification of either of these two attributes automatically results in an associated change to the finite element mesh. It will be further appreciated that although an example of a 3D object is described, the geometric attributes also apply to non-3D objects, such as, for example, 1D, 6 degrees of freedom (dof) beam element representation of a shaft or other component, which can be derived by means of a suitable mathematical abstraction and or condensation. Each assembled object is provided with a set of available boundary conditions, which effectively define the interaction between the object, other associated objects, and the external environment at a particular interface. The available boundary conditions may be set or modified by a user of the simulation environment, in operation to set up a simulation.

The available boundary conditions are applied through the geometric attributes to a particular interface surface, for example the outer cylindrical surface of a shaft. They are object dependent, and are used for constraining and defining the initial conditions at the interface surfaces, for the purposes of simulation of the object and its interaction both with other objects that it interfaces with, and with the surrounding environment.

The boundary conditions may comprise any suitable physical conditions. They may for example be structural such as in the case of constraints, supports or bearings, and can include prescribed translations and/or rotations. Alternatively or additionally, they may comprise initial fluid, thermal, electromagnetic, or chemical related conditions and may include velocities, accelerations, pressures, heat fluxes, heat transfer coefficients, voltages and/or electric currents or the like.

FIG. 2 shows how simple basic quadrilateral 2D elements 30 may be interconnected via the associated connectivity sides 34 to form a more complex angle shape having a continuous mesh. Interconnection is governed by rules of connectivity, which ensure a continuous mesh at the interfaces between the connectivity sides, despite each element 30 having a different mesh pattern, each with a different mesh spacing.

As seen in the table of FIG. 4(*a*), each assembled object has a modifiable set of attributes defining its geometry. FIG. 3, for example, shows a 3D component object 42 in the form of an angle object assembled from three generally cuboid elements 32, each of which has been formed by an extrusion transformation 44 on a corresponding 2D element 30 from FIG. 2. The geometry of the assembled object is defined by a set of geometric attributes comprising length 'L', width 'W', vertical thickness 'Y', horizontal thickness 'X', and depth 'Z'.

Similarly, each object is provided with a set of modifiable physical and/or material attributes, as seen in table 4(b), for subsequent derivations and multi-physics based simulations. For example, the physical/material attributes might include parameters for density, Young's modulus, Poisson's ratio, thermal conductivity, thermal capacity, endurance limit, yield strength, permeability, electrical conductivity, resistivity, or the like.

Additionally, as seen in FIG. 4(*c*), each object is provided with a set of attributes derived from the user inputted data, such as the geometric and material/physical attributes. The derived attributes will be object specific, but will typically include, mass, volume, centre of mass, centre of gravity, area, finite difference mesh, finite volume mesh, and/or finite element mesh attributes or the like.

In operation, therefore, changes to any of the geometric attributes, at the assembled object level, result in associated changes both to the finite objects 34 from which the angle object 42 is assembled, and to the corresponding finite element mesh. For example, an increase in the depth attribute 'Z' to make the angle object 42 of FIG. 3 more elongate will result in an associated increase in the extent of the extrusion transformation applied to the 2D elements 30, to form the 3D elements 32. Similarly, if the mesh spacing is kept constant, the increase in 'Z' will result in changes to the derived mesh attributes to provide additional mesh nodes in the extrusion direction.

In addition to component objects assembled from finite objects, the simulation environment 10 is also provided with a plurality of tribological elements including bearing objects, and objects for representing fluids such as lubricant, and the like.

As seen in FIG. 4(*d*) the tribological objects are provided with a set of appropriate modifiable attributes, such as, for example, viscosity (at temperature), density (at temperature), specific heat, thermal conductivity, thermal expansivity, pressure viscosity coefficient, eyring shear stress, limiting shear stress etc. The tribological objects may be assembled into complex systems in a similar manner to the component objects to allow tribological analysis to be undertaken. The geometry of tribological elements, however, is defined by the objects assembled around them, for example, by the clearance between two component objects.

Figure 5:
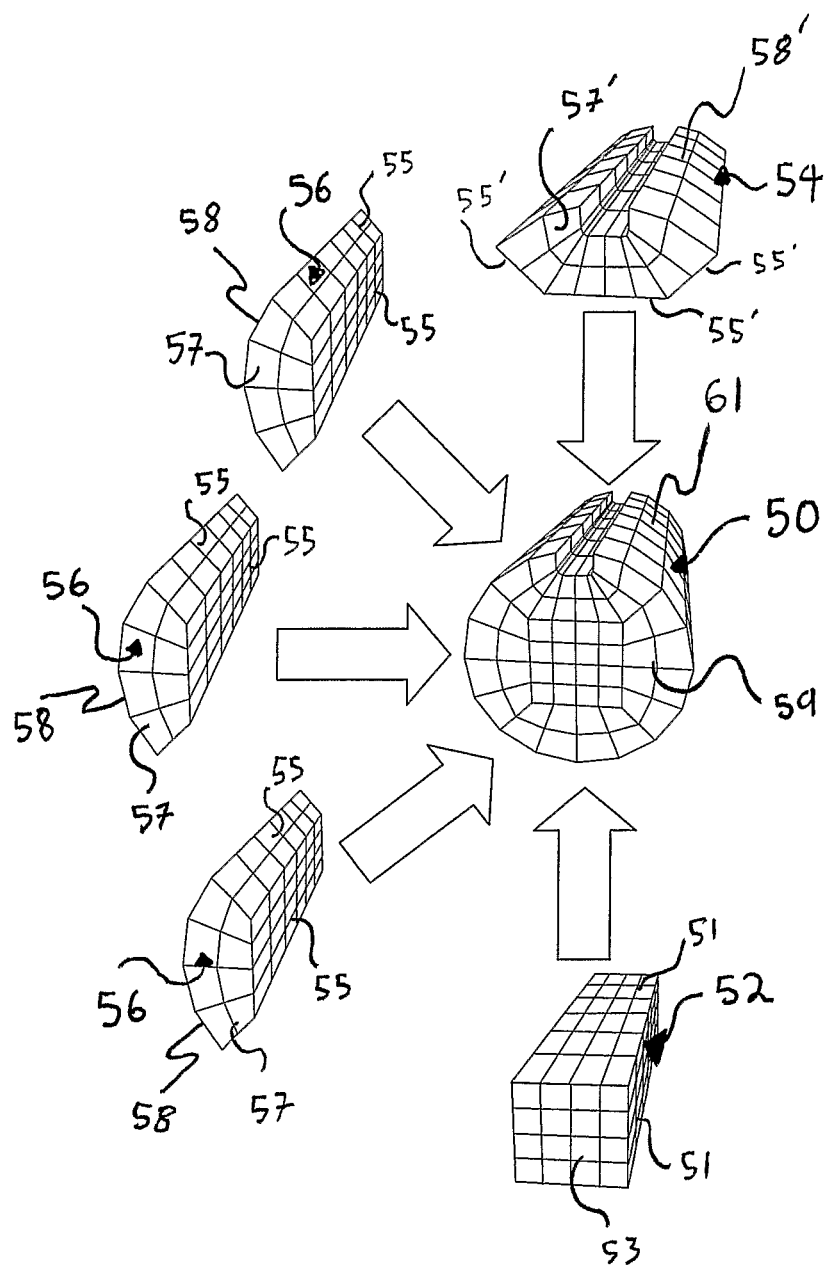
FIG. 5 is a diagram illustrating assembly of a keyed shaft object from a plurality of finite objects.

FIG. 5, shows a practical example of finite object assembly relevant to engine development. In FIG. 5, an untapped keyed shaft object is shown at 50. The keyed shaft object 50 comprises an assembly of five 3D finite objects 52, 54, 56: A single core finite object 52; a single keyed segment finite object 54; and three quarter segment finite objects 56. The core 52 is an elongated cuboid of substantially square cross-section. The keyed segment 54 and quarter segment finite objects 56 each comprises a quarter segment of an externally cylindrical tube, where the tube has internal shape and dimensions corresponding to the core finite object 52. The keyed finite object 54, however, is further provided with a longitudinal keyed channel 58 known as a keyway.

The core finite object 52 forms the centre of the keyed shaft object 50 and has four connection surfaces 51 and two interface surfaces. Each keyed and quarter segment 54, 56, has three connection surfaces 55, 55', one of which connects with a corresponding connection surface 51 of the core 52. Each of the remaining connection surfaces connects with a corresponding connection surface of one of the other segments 54, 56, to form a generally cylindrical keyed shaft 50, having a longitudinal keyway 58.

Each quarter segment 54 also comprises two end surfaces 57 and a curved radially outer surface 58. Similarly the keyed segment has two end surfaces 57' and a keyed and curved radially outer surface 58'. The end surfaces 57, 57', comprise interface surfaces, which together with the interface surfaces 53 of the core object 52, form an end interface surface 59 of the keyed shaft 50. Similarly, the radial outer surfaces 58, 58' comprise interface surfaces, which combine to form a radially outer interface surface 61 of the shaft 50.

Thus, the provision of re-usable finite objects allows assembly of the keyed shaft object 50 from five elements of only three different finite object types.

Like other objects assembled in a similar manner, the geometry and physical properties of the untapped keyed shaft object 50 are driven by suitable geometric and physical/material attributes respectively. For example, geometric attributes for the keyed shaft 50 would include outer diameter, length, keyway width, keyway depth, and keyway root radius. Similarly, a keyed shaft having a tapped thread might further include hole depth, hole diameter, thread depth and tap depth attributes.

Connection of the finite objects 52, 54, 56, to form the keyed shaft object 50, occurs at the interfaces between corresponding connection surfaces, and is governed by rules of connectivity as described previously. The rules of connectivity ensure a continuous, geometry dependent, mesh throughout the keyed shaft object 50, which automatically changes, in operation, if the geometric attributes of the keyed shaft object are modified. Similarly, onward assembly of the objects into more complex sub-systems and systems is governed by rules of connectivity at the interface surfaces.

Hence, in operation, a plurality of component parts for the engine system may be built and their geometric and physical attributes defined, thus resulting in appropriate automatic derivation of additional attributes such as finite element mesh or the like. These components may subsequently be assembled to form sub-systems of the engine system such as valve trains, crankshafts, etc. The assembled sub-systems may similarly be assembled in a hierarchical fashion, ultimately to form a complete system such as an engine system, whole vehicle system or the like.

The mesh data inherent to the finite objects are inherited by the objects into which the finite objects are assembled, albeit modified in accordance with the geometric attributes assigned to the component object. Thus, the sub-system and the system assemblies each includes appropriate mesh data. If the geometric or other attributes of a particular component object are modified, the changes automatically filter through to the assembled system and each instance of the component object.

The simulation environment 10 may be used, for example, to build/assemble an object assembly representing an engine of any configuration. A plurality of typical engine system assemblies will now be described, by way of example, only with reference to FIGS. 6 to 13.

Figure 6:
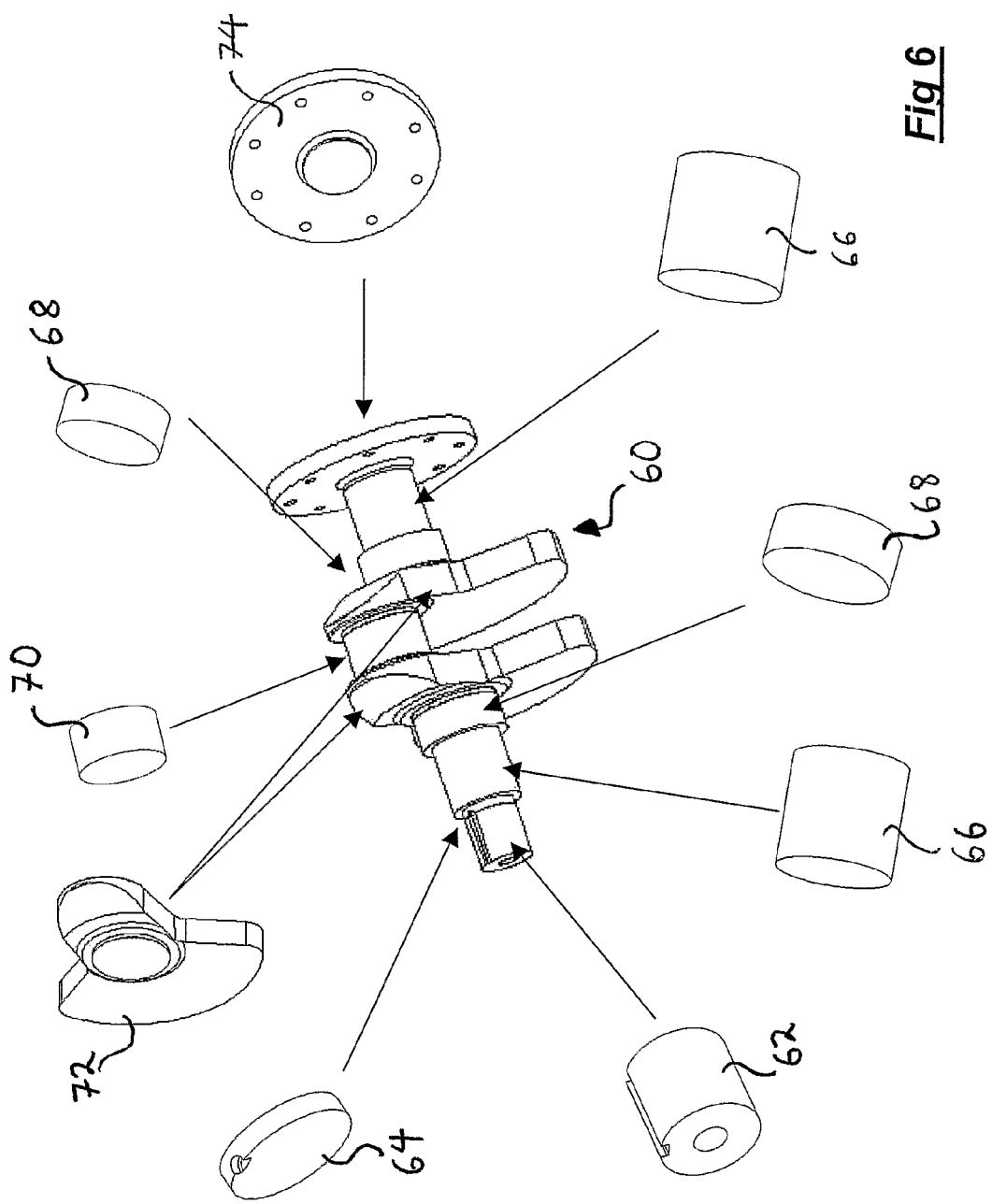
FIG. 6 is a diagram illustrating assembly of a crankshaft assembly object from a plurality of less complex objects.
Figure 7:
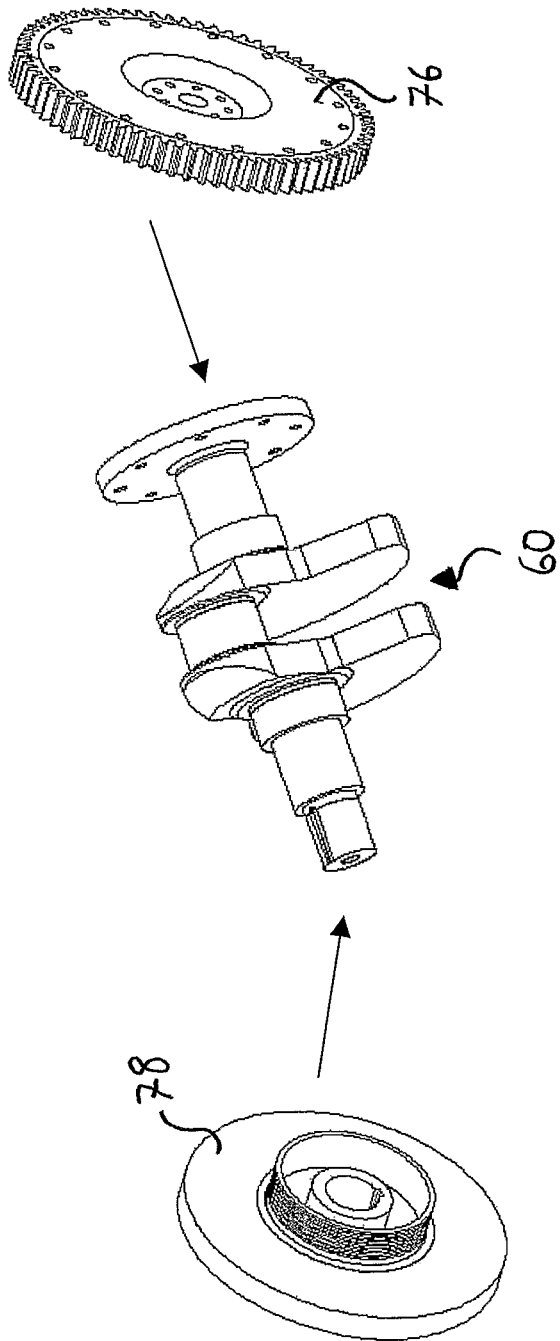
FIG. 7 is a diagram illustrating the assembly of the crankshaft object assembly of FIG. 6, with a flywheel object sub-assembly and a damper object sub-assembly.

In FIG. 6 a crankshaft assembly object is shown at 60. The crankshaft assembly object 60 is assembled from a plurality of less complex component objects, each having geometric, physical/material, and derived attributes as generally described previously. The crankshaft object 60 comprises an assembly of: a tapped keyed shaft object 62; a keyed shaft end object 64; two shaft portion objects 66; two main journal objects 68; a crank pin object 70; two web objects 72; and flywheel flange object 74. In FIG. 7, the crankshaft object 60 is further assembled with a flywheel sub-assembly object 76 and a damper sub-assembly object 78.

It will be appreciated that objects such as the crankshaft may also be modelled as a lump mass and beam system, or as rigid bodies.

Figure 8:
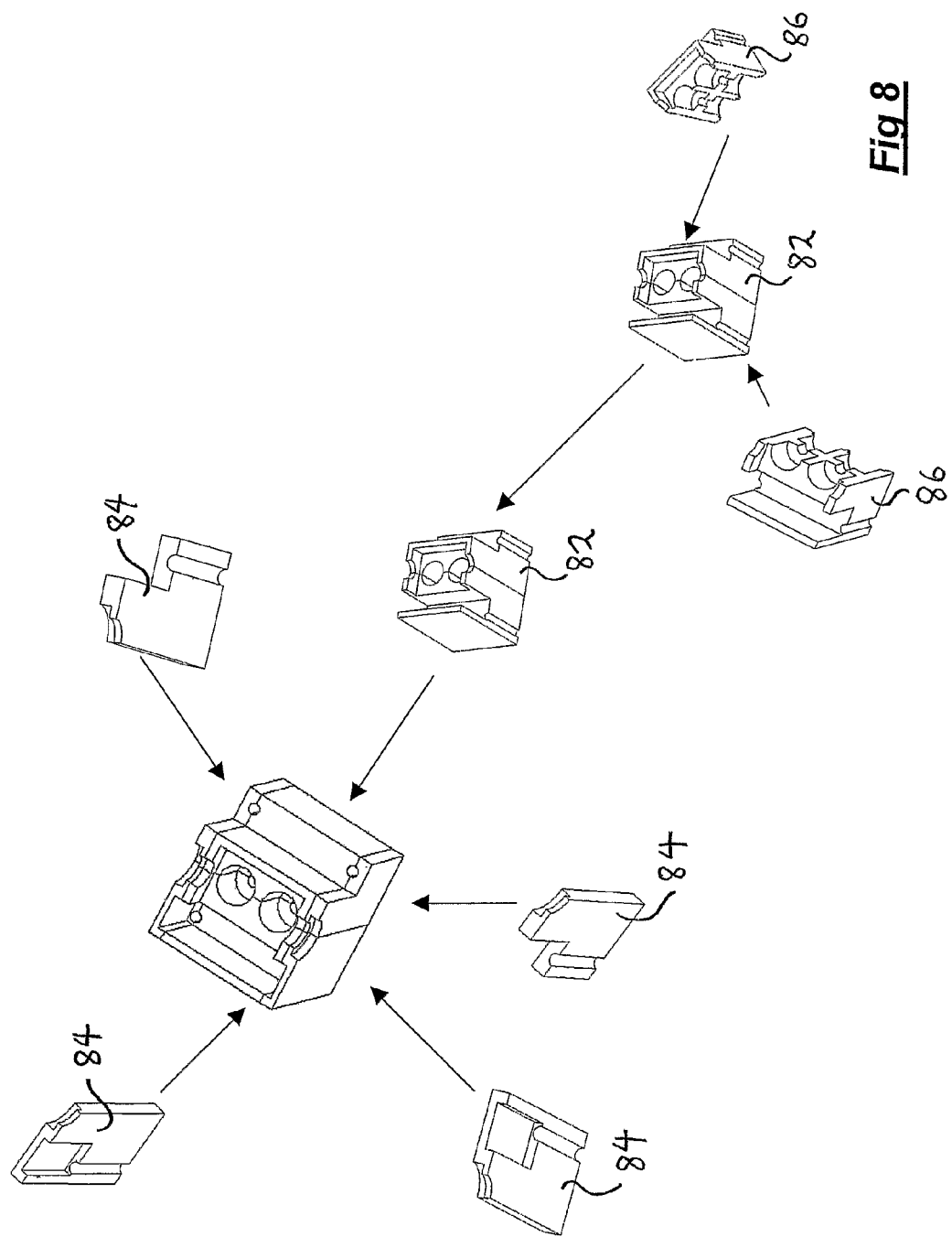
FIG. 8 is a diagram illustrating the assembly of a cylinder head object from a plurality of less complex objects/object assemblies.

In FIG. 8 a cylinder head object for a single cylinder inline engine configuration (I1) is shown at 80. The cylinder head object 80 is assembled from a reusable head object 82, and a plurality of other component objects 84. The reusable head object 82 is common to all the cylinders in a particular valve train, and is itself assembled from less complex sub-component objects 86. Thus, in operation, a plurality of the re-usable head objects 82, in combination with other suitable component objects, may be assembled to form a head assembly for a multiple cylinder engine configuration. Thus, the reusable head objects are designed for application in any engine cylinder block configurations including I1 to I12, V2 to V16, and gasoline or diesel engine configurations.

Figure 9:
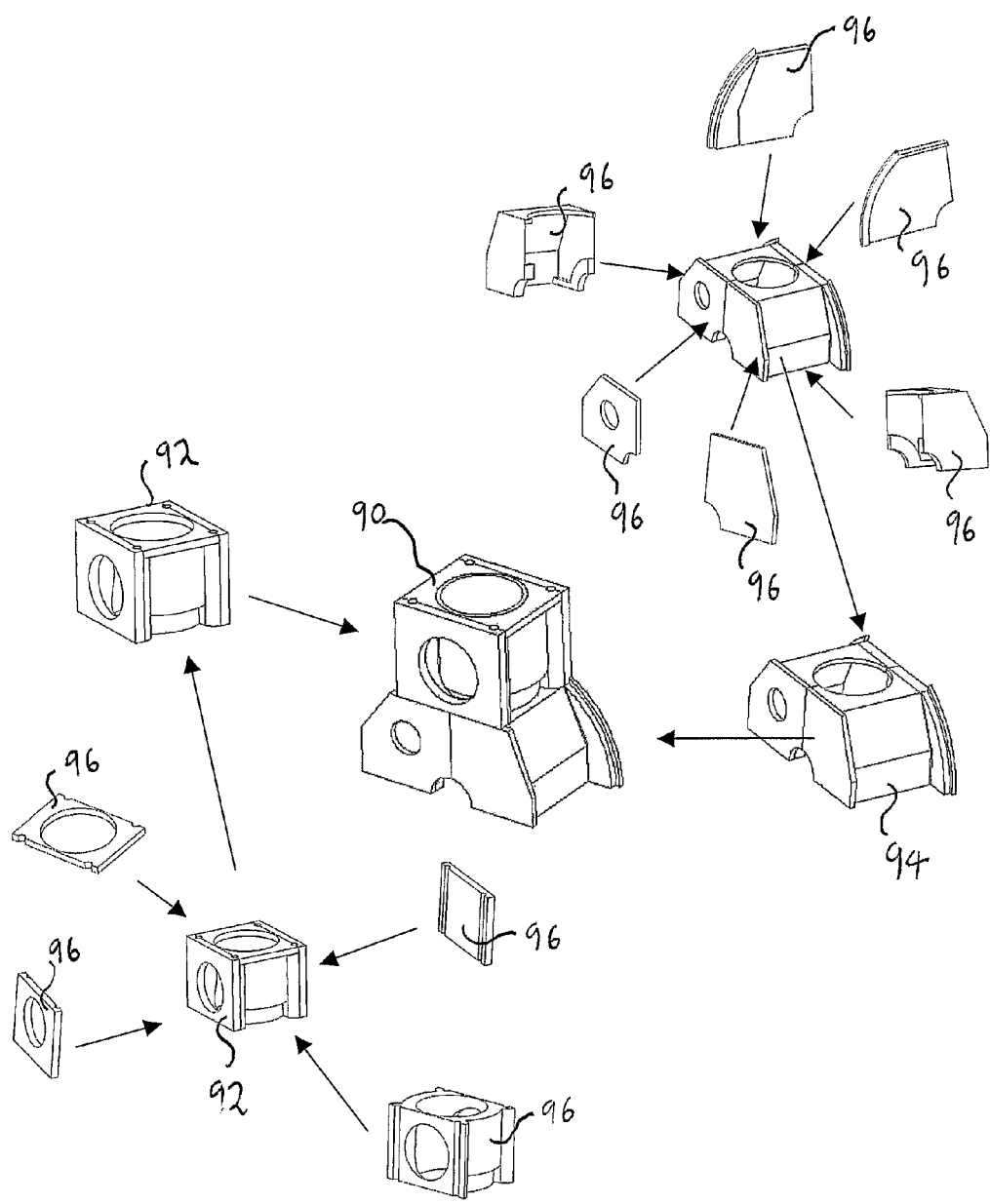
FIG. 9 is a diagram illustrating the assembly of a crank case object from a plurality of less complex objects/object assemblies.

In FIG. 9 a cylinder block object for the single cylinder inline engine configuration (I1) is shown at 90. The cylinder block object 90 comprises a cylinder case object 92 and a crank case object 94, each of which is assembled from a plurality of suitable re-usable sub-component objects 96, designed for use in any of a range of engine configurations, for example, I1 to I12, V2 to V16, and gasoline or diesel.

Figure 10:
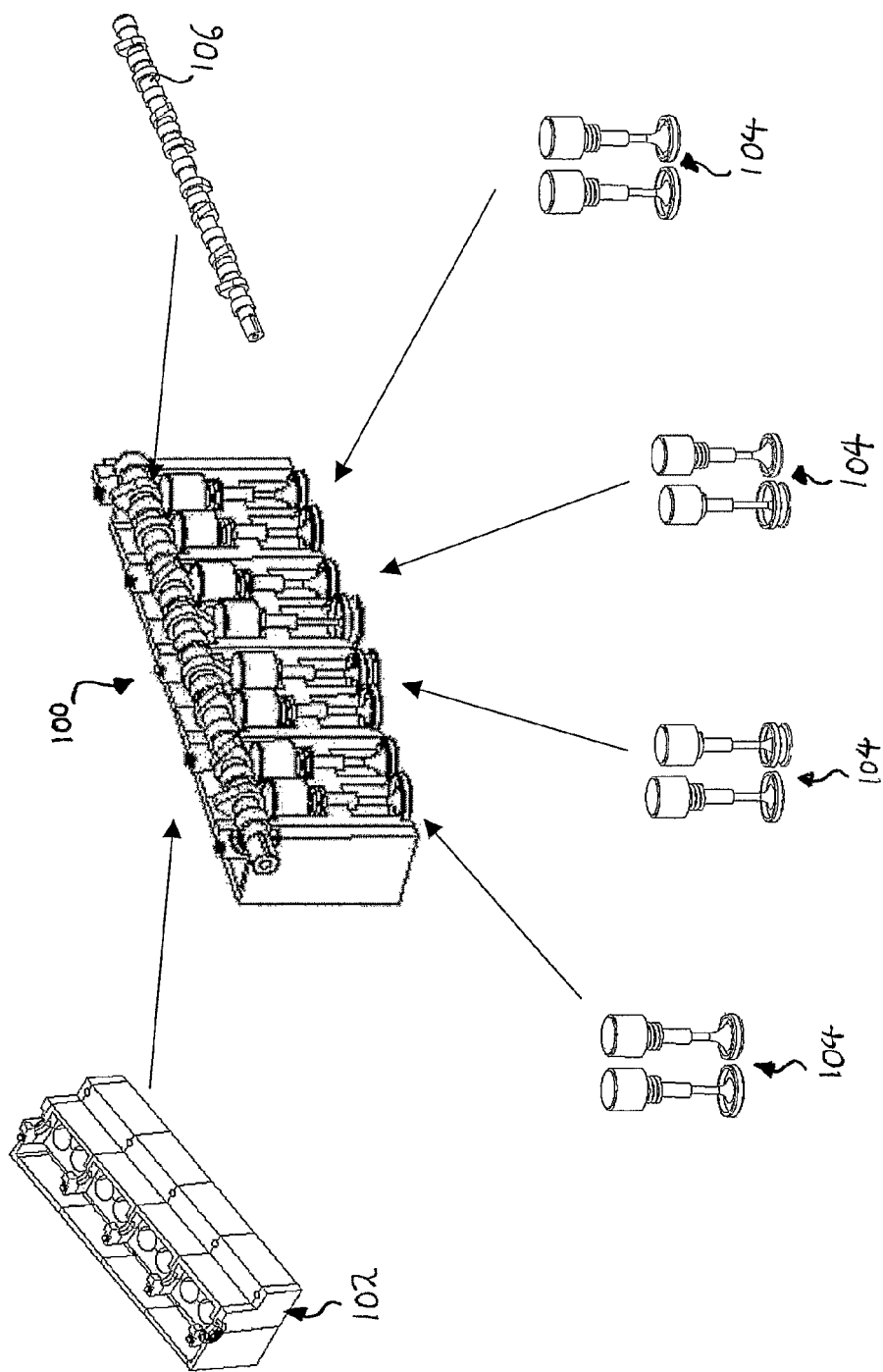
FIG. 10 is a diagram illustrating the assembly of a valve train assembly object for a four cylinder inline diesel engine.
Figure 11:
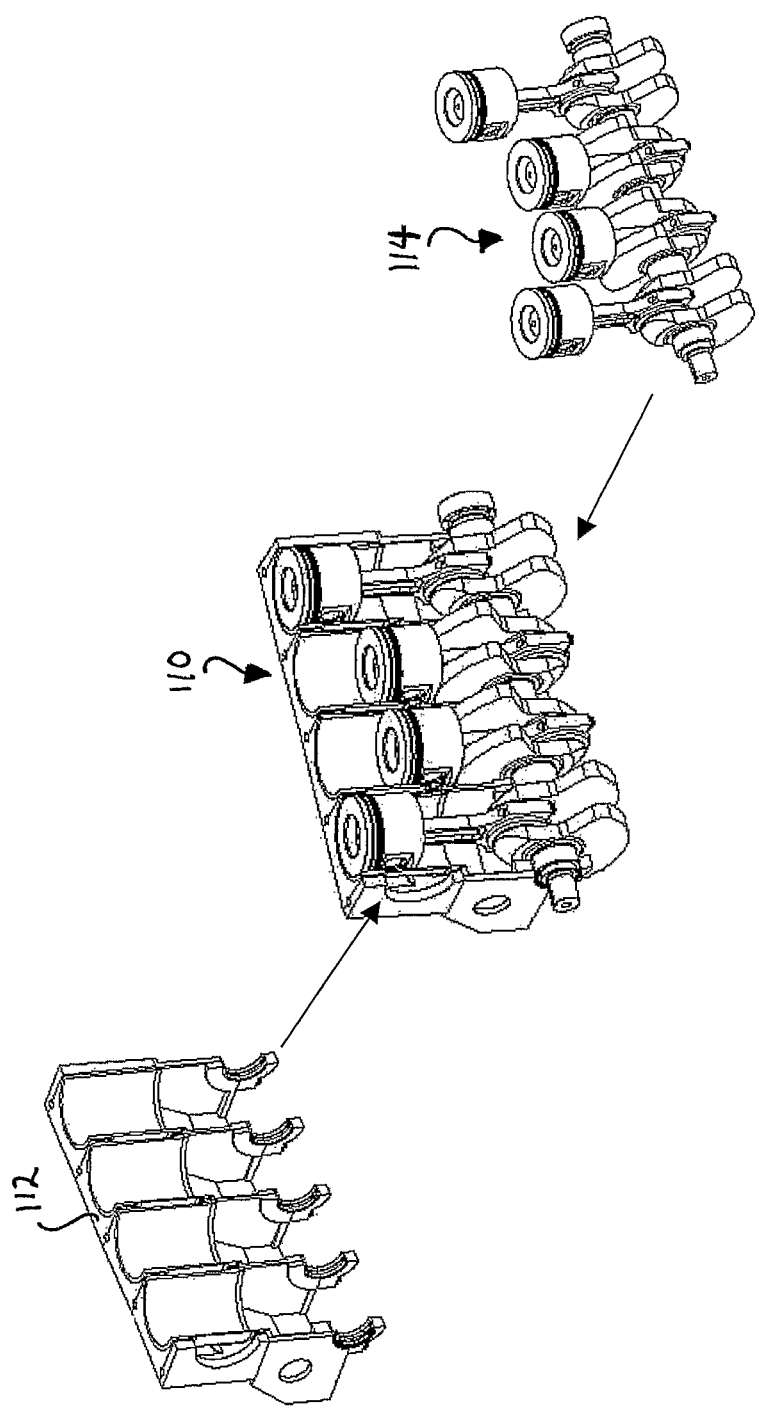
FIG. 11 is a diagram illustrating the assembly of a block and crank train assembly objects for the four cylinder inline diesel engine.

In FIG. 10 a valve train assembly object for a four-cylinder inline diesel engine configuration (I4D) is shown at 100. The valve train assembly 100 is built from: a head assembly object 102; four cylinder valve train (CVT) objects 104 each comprising an inlet and an exhaust single valve train (SVT) object; and a camshaft assembly object 106. Each assembly object forming part of the valve train assembly object 100 is assembled from a plurality of less complex objects in the manner described previously. For example, the head assembly object 102 might be built up from objects including four of the reusable head objects 82, as described with reference to FIG. 8, In FIG. 11, assembly of a cylinder block assembly object 112 and crank train assembly object 114, for the I4D engine configuration, is generally shown at 110. The block assembly object 112 comprises liner, main bearing end cap, seal and bearing shell objects. Similarly, the crank train assembly object 114 comprises piston, pin, ring, connecting rod, small end shell, and big end shell objects.

Figure 12:
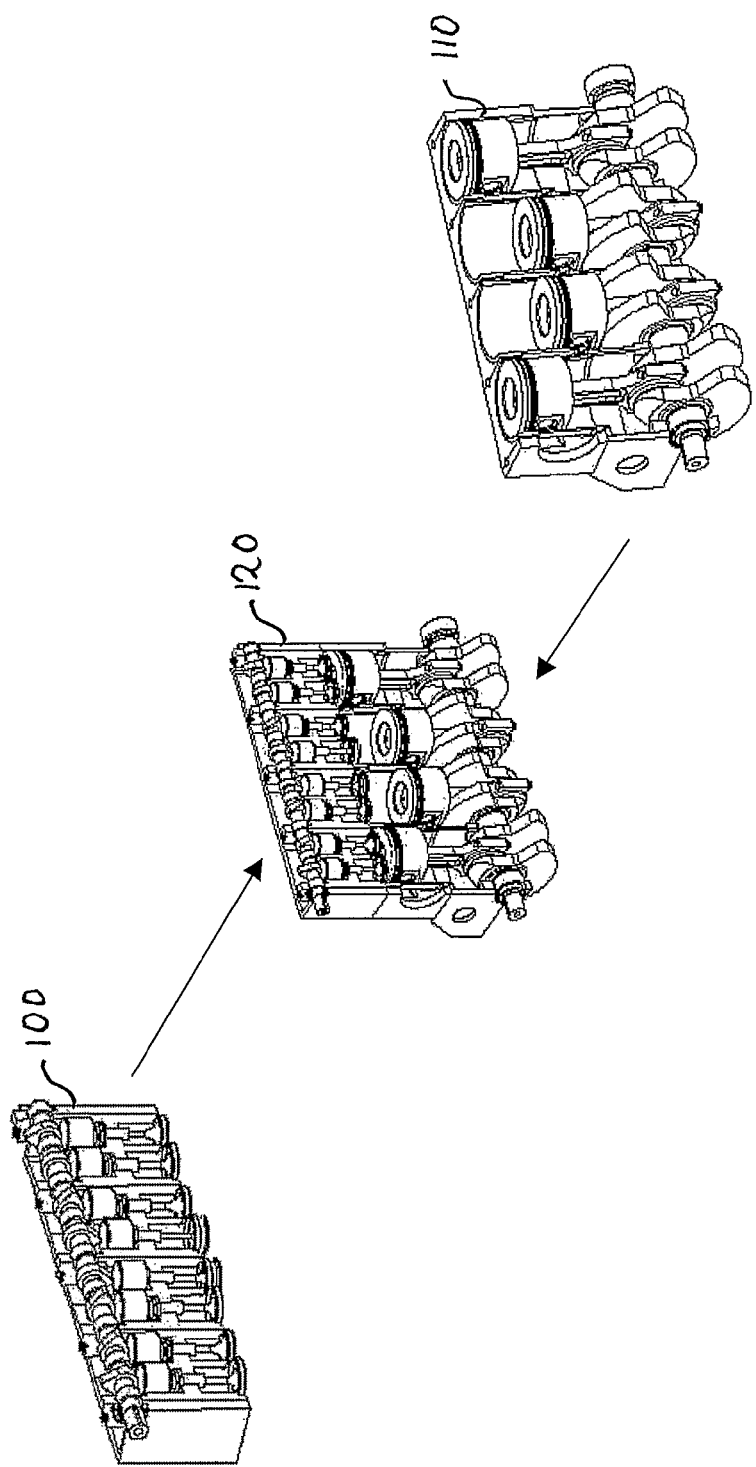
FIG. 12 is a diagram illustrating the assembly of an engine assembly object from a plurality of less complex object assemblies for the four cylinder inline diesel engine.

In FIG. 12 an engine assembly object for the I4D engine configuration is shown at 120. The engine assembly is built from the valve train assembly object 100 and the block and crank train assembly 110, described with reference to FIGS. 10 and 11 respectively.

Figure 13:
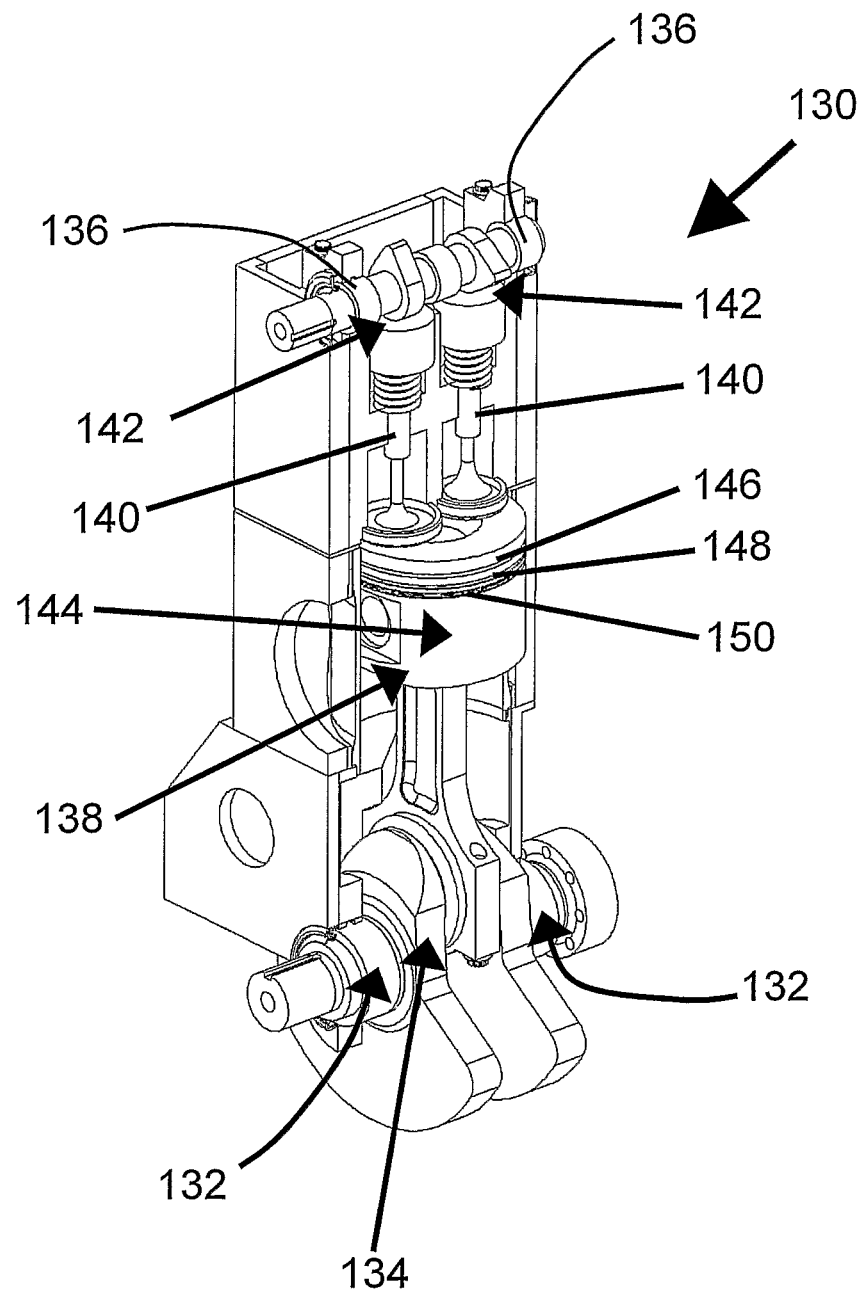
FIG. 13 is a diagram showing an engine assembly object for a single cylinder inline engine configuration including tribological elements.

FIG. 13 illustrates the inclusion of tribology elements into a system for allowing friction/lubrication analysis to be undertaken. In FIG. 13, an engine assembly object, of an I1 configuration is shown generally at 130. The engine assembly 130 comprises a plurality of tribological elements, in addition to the component objects forming the rest of the physical system. The tribological elements comprise a plurality of bearing objects and a plurality of lubrication objects.

The bearing objects include objects representing: two main bearings 132 around the main journals of the crankshaft assembly object; a big end bearing 134 around the crank pin; two cam bearings 136 at appropriate locations on the camshaft assembly object; one small end bearing 138 between the piston pin and the piston rod; and two valve guide bearings 140.

The lubrication objects include: two cam/tappet lubrication objects 142 between the cam surfaces and tappets; a piston and liner lubrication object 144 between the piston of the I1D crank train assembly object and the liner of the I1D block assembly object; and top, second, and oil ring lubrication objects 146, 148, 150 at appropriate locations on the piston. The I1D engine assembly 140 is further provided with appropriate seal objects and balancer shaft objects.

Thus, the engine assembly object includes objects representing every component of a real world system thereby allowing accurate simulation and analysis. Similarly, the engine assembly automatically includes a good quality mesh sufficient for accurate FE or CFD analysis.

Figure 14:
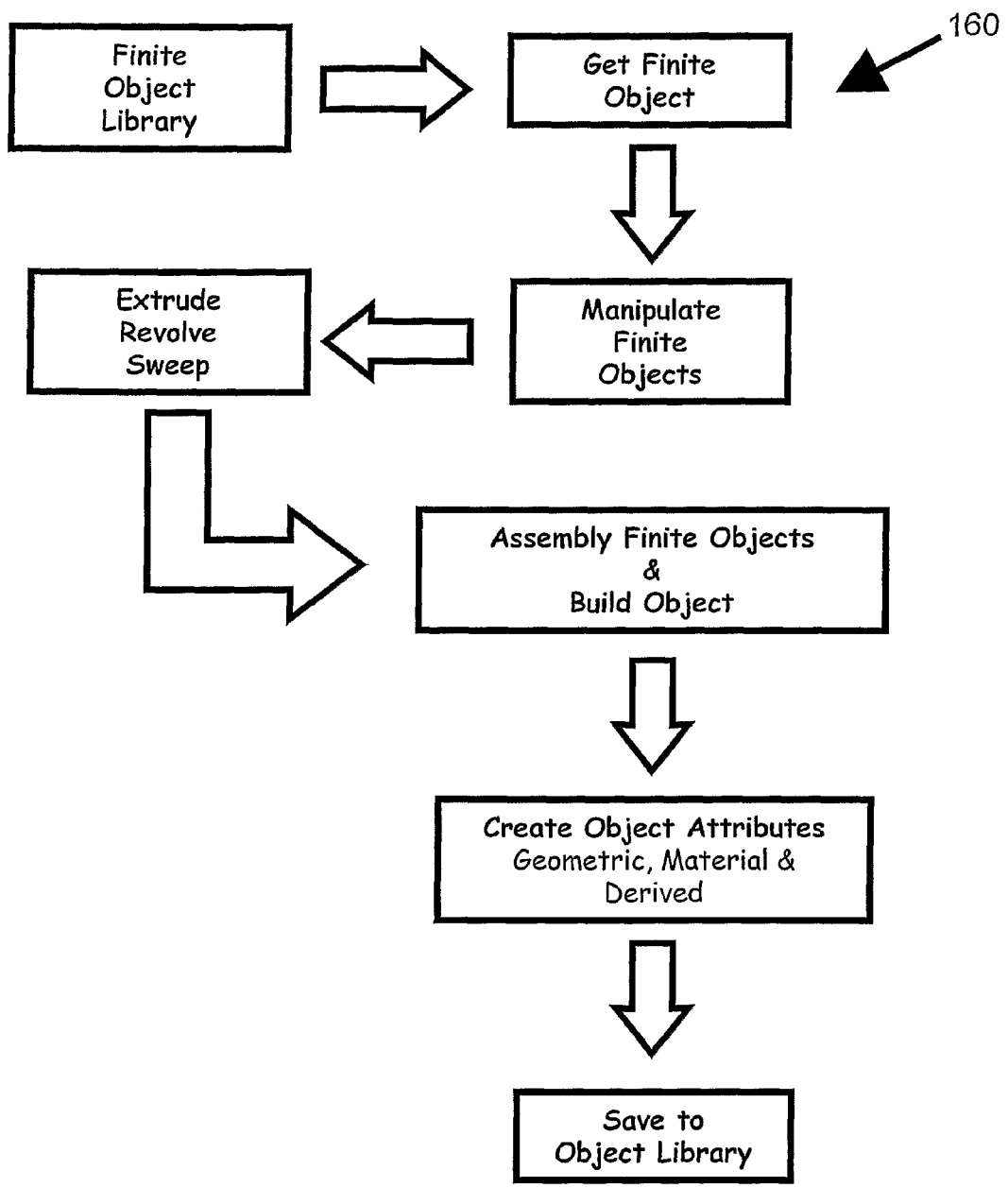
FIG. 14 is a flow diagram illustrating an object builder environment for the assembly of finite objects into a component object.

Typical operation to create a component object will be described, by way of example only, with reference to FIG. 14 in which a flow chart illustrating an object builder environment is shown generally at 160. Initially 2D finite objects are selected from the finite object library. The selected objects are manipulated using an extrusion, revolution or sweep transformation to form 3D finite objects of the desired shape. The 3D finite objects are then assembled to form the desired component object. Once the component object is built geometric, physical/material, and derived attributes for the component object are defined before the object is saved into the object library. Thus, the component object is available for assembly into object assemblies. Similar objects of different sizes and/or materials may be defined simply by changing the geometric and/or physical/material attributes accordingly.

It will be appreciated that a simple component object may comprise a single 3D finite object rather than an assembly of objects.

Figure 15:
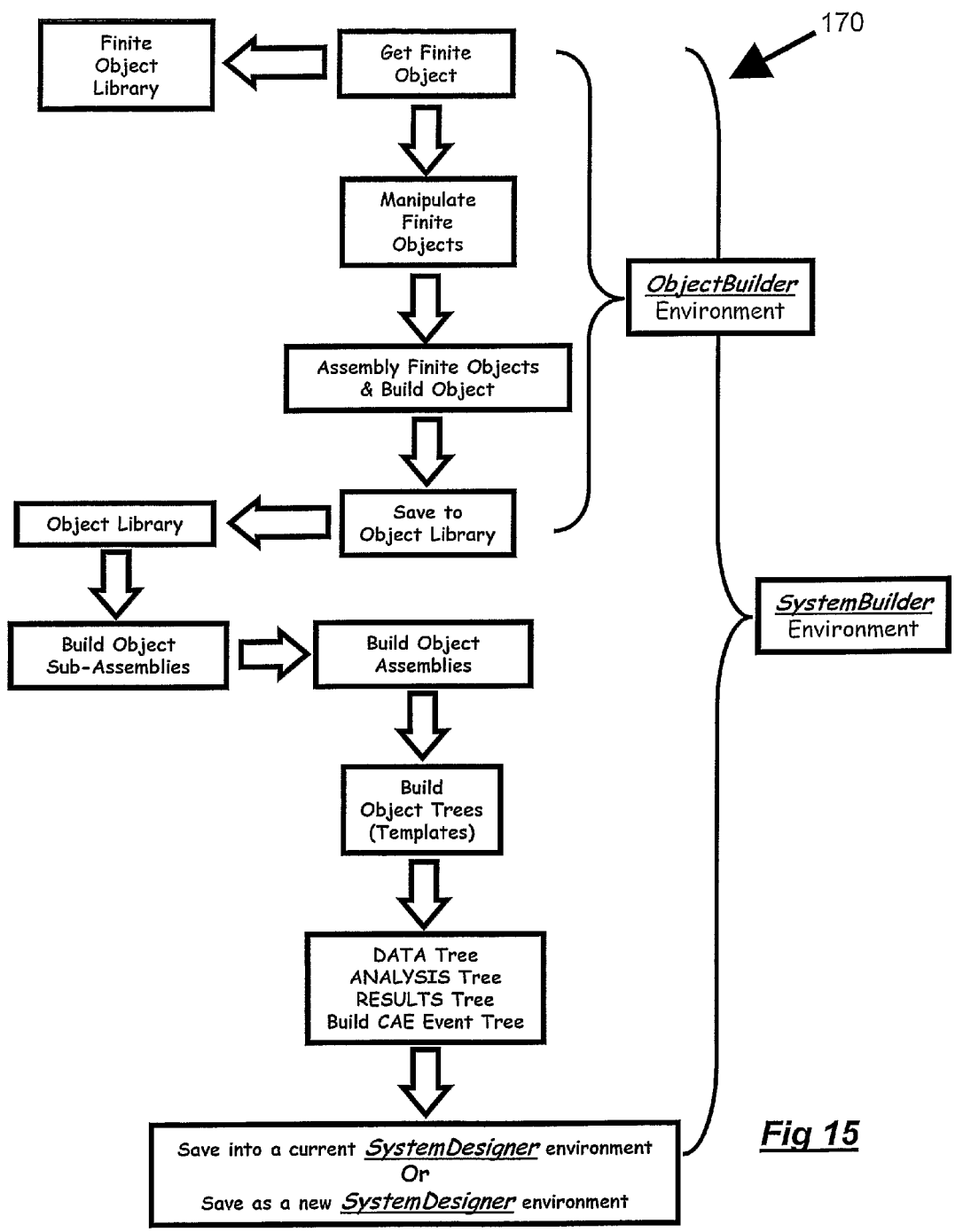
FIG. 15 is a flow diagram illustrating a system builder environment for the assembly of assembled component objects into a sub-system, or system assembly.

In FIG. 15, a flow diagram illustrating a system-builder environment for building a system is shown generally at 170. Operation to build a system begins by populating the object library with a plurality of component objects using the object builder environment as generally described with reference to FIG. 14. Once the library is populated, appropriate component objects are selected and built into object sub-assemblies. The object sub-assemblies are then built into object assemblies representing the desired system or sub-systems of the desired system, for example an engine system. The object sub-assemblies and object assemblies are saved as templates (object trees) into an existing system designer environment or a new system designer environment.

The system builder environment 170 also allows building and defining of a CAE event tree, which defines the type of analysis carried out on the system, and the order in which the analysis is carried out. This allows integration with appropriate CAE analysis software including third party applications. The types of analysis can include any appropriate method including 1-D, 2-D or 3-D analysis, and even analytical design rule checking or the like.

The main CAE events that take place for an engine system (neglecting manufacturing and assembly processes), for example, include: fuel injection; combustion simulation; cycle simulation; heat transfer and cooling; thermal stress analysis; lubrication and friction; structural dynamics and NVH; and durability.

The ability to create new objects, systems and CAE events is controlled, allowing only specific users, such as system developers to create new systems and system configurations. Other users, such as engine designers and CAE engineers are constrained, within the simulation environment, to selecting and modifying pre-defined system configurations. The users constrained to using pre-defined engine configurations still have flexibility to modify and develop those systems, for example, by changing the geometric and other attributes and/or selecting alternative components where the simulation environment allows such selection. Thus a CAE engineer or engine designer may construct optimisation design of experiments (DOEs) based on, for example, geometry or the like.

The simulation environment 10 comprises at least one designer framework for use at the CAE/design engineering level, for the assembly, simulation and analysis of a particular system. In an engine design system, for example, an engine designer framework, is provided for the assembly, simulation and analysis of an engine. The designer framework is operated by means of a graphical user interface comprising an object tree of icons representing the objects making up each system and sub-system, thereby allowing a user to navigate through the object hierarchy, in operation, for example, to modify specific object attributes.

Figure 16:
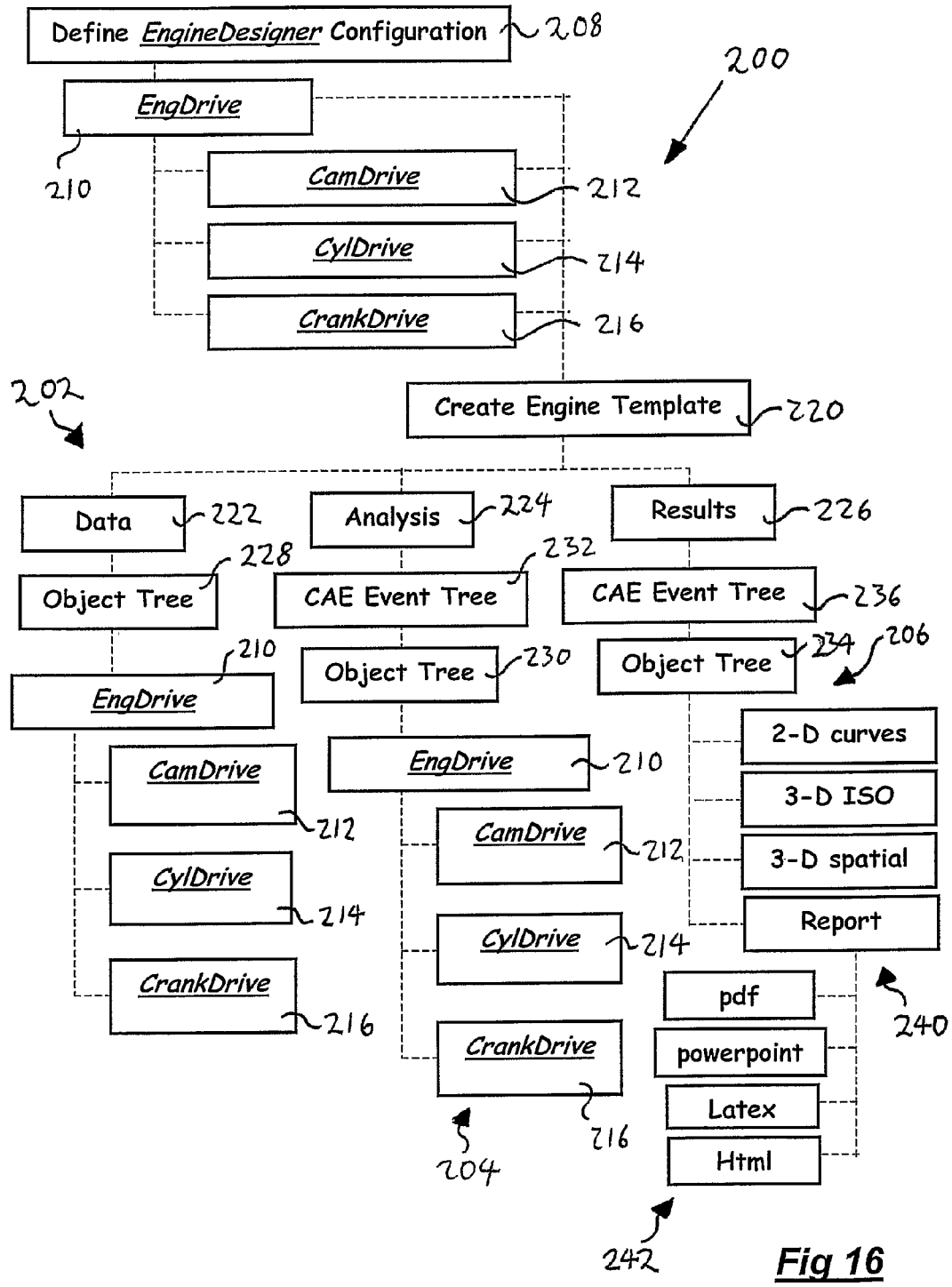
FIG. 16 is a schematic block diagram of an engine designer framework.

In FIG. 16, a schematic block diagram illustrating operation of an engine designer framework is shown generally at 200. The engine designer framework 200 comprises three interlinked environments, an engine data environment 202, an engine analysis environment 204 and an engine results environment 206. In operation, initial engine configuration 208 occurs through the engine data environment 202, during which the main configuration parameters for the engine are selected through the user interface.

Within each environment 202, 204, 206, the engine designer framework 200 allows user interaction with the main engine system object assembly (EngDrive) 210, or with any of a plurality of sub-system object assemblies 212, 214, 216, (CamDrive, CylDrive, CrankDrive). CamDrive 210, CylDrive 212, and CrankDrive 214, respectively represent the valve train, cylinder block and crank train sub-system assemblies of the engine system.

Initial configuration via EngDrive 210, typically includes selecting parameters for engine configuration (e.g. inline or 'V' type), engine type (e.g. racing), fuel type (e.g. gasoline or diesel), number of cylinders (e.g. 2 to 16 for 'V' type), and the number of valves per cylinder.

CamDrive 212 configuration typically includes selection of the valve train system (e.g. direct acting), CVT tappet type (e.g. no shim), cylinder head type (e.g. aluminium), total number of cam-shafts and the number of cam-shaft bearings per cam shaft.

CylDrive 214 configuration typically includes selection of the number of piston pin bearings, number of conrod small end bearings, the piston type (e.g. articulated), and the conrod type (e.g. forged).

CrankDrive 216 configuration typically includes definition of the total number of balancer shafts, weights and bearings, the flywheel type (e.g. single mass), the damper type (e.g. viscous), and the number of main bearings.

It will be appreciated that different options will be available depending on the type and configuration of engine being set up.

It will be further appreciated that there may be additional sub-system objects representing, for example, an auxiliary system driver (AuxDrive) comprising generator, turbo, pump, and cooling fan, objects or the like, and/or a lubrication sub-system driver (LubeDrive).

Figure 17A:
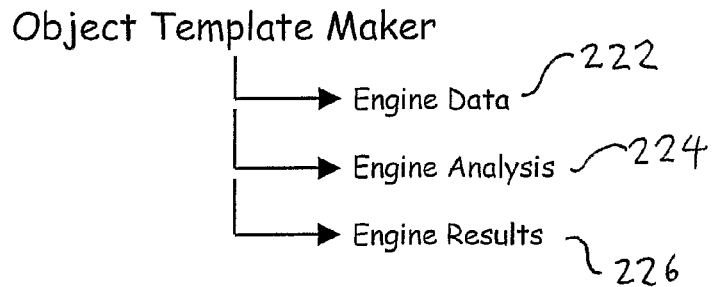
FIG. 17(*a*) illustrates a portion of an object template maker object tree for the engine system.

In operation, once configured the engine designer framework 200 generates an engine template 220, as shown in FIGS. 16 and 17(a), comprising engine data object template 222, an engine analysis object template 224 and an engine results object template 226.

Figure 17B:
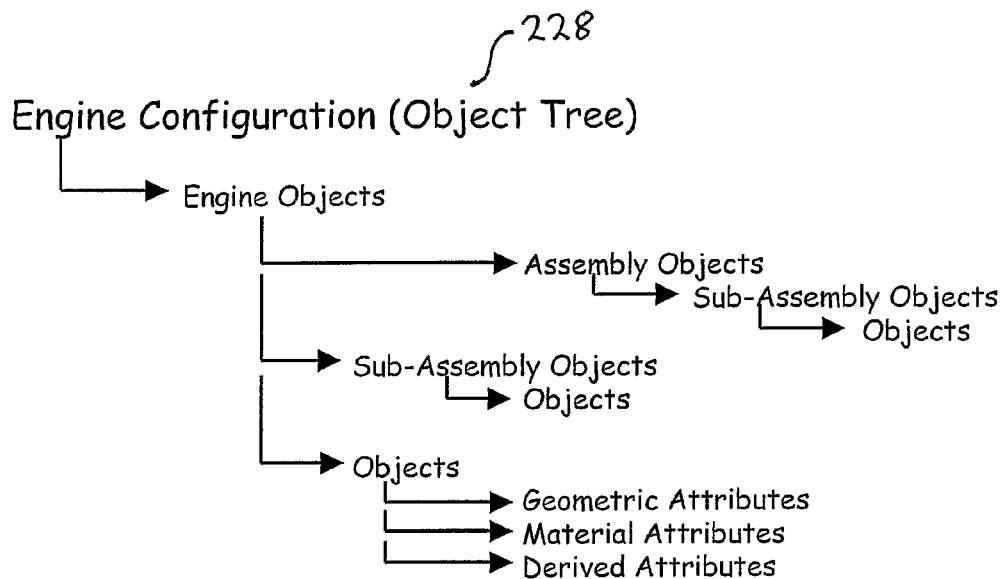

As seen in FIGS. 16 and 17(b) the engine data template 222 comprises an engine configuration object tree 228 divided into as many different levels of abstraction as required by the application. For example, the engine configuration object tree may be abstracted into assembly objects, sub-assembly objects, component objects (objects), and finite objects. The engine configuration data tree is navigatable in the engine data environment 202. The engine data template 222 allows the geometric and physical/material attributes, and consequently the derived attributes, to be modified appropriately, at the component object level, via the user interface.

Figure 17C:
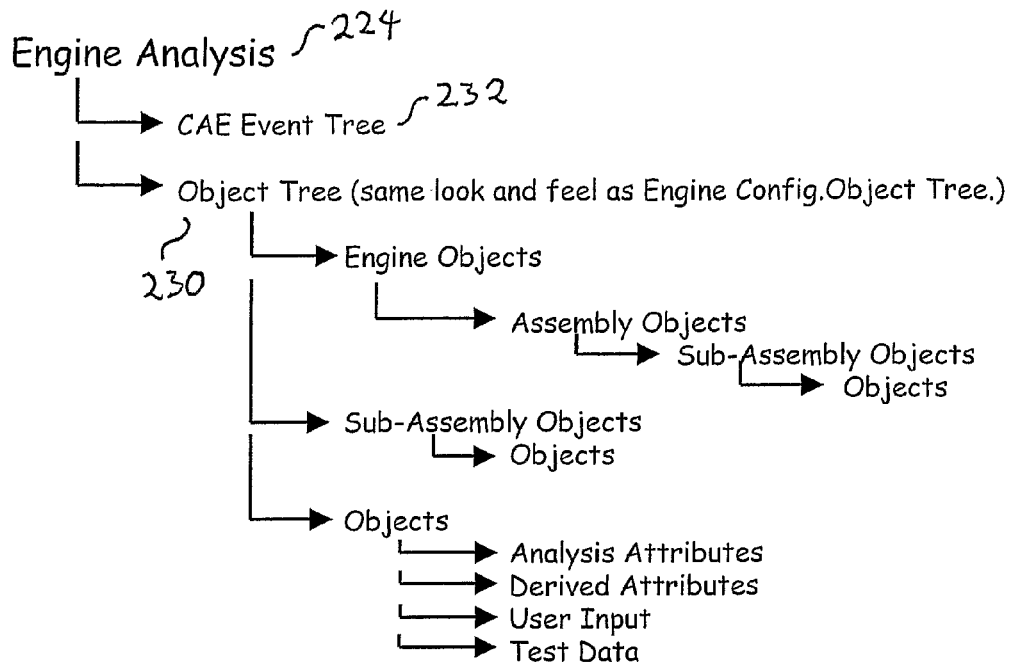

As seen in FIGS. 16 and 17(c) the engine analysis template 224 comprises an engine analysis object tree 230, similar to the engine configuration object tree 228, and a CAE event tree 232 for conducting CAE analysis on the systems and/or sub-systems represented by the object tree. The engine configuration data tree is navigatable in the engine analysis environment 202. At the component object level the analysis environment 204 allows analysis data to be input, where appropriate, for each CAE analysis event. From this data, and/or the derived attributes for a component object, a set of analysis attributes is further derived. Examples of analysis attributes include oil flow rate, temperature, spring stiffness etc. After an analysis event has been completed test data is stored, where appropriate, at a component object level for display in the results environment 206.

Figure 17D:
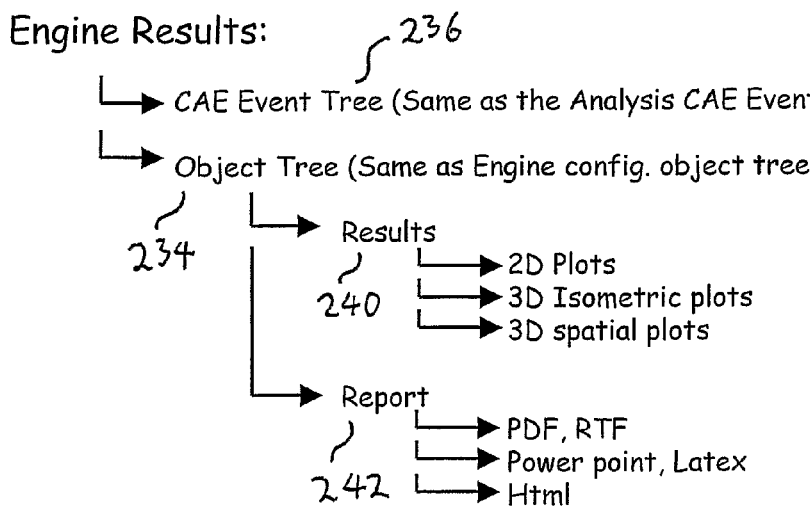

As seen in FIGS. 16 and 17(d) the engine results template 226 comprises an engine results object tree, similar to the engine configuration and analysis object trees 234, and a CAE event tree 236 similar to the CAE event tree for the analysis template 224. The engine results object tree is navigatable in the engine results environment 206. At the component object level the results environment 206 allows the results of completed analysis to be plotted, displayed and/or reported. Results may be displayed 240 or plotted 242 using any suitable graphical representation, for example, using 2D plots, 3D isometric plots, 3D spatial plots or the like. Similarly, results may be reported in any suitable format, for example, portable document format (pdf), rich text format (rtf), PowerPoint®, Latex®, or hyper-text mark-up language.

Figure 17E:
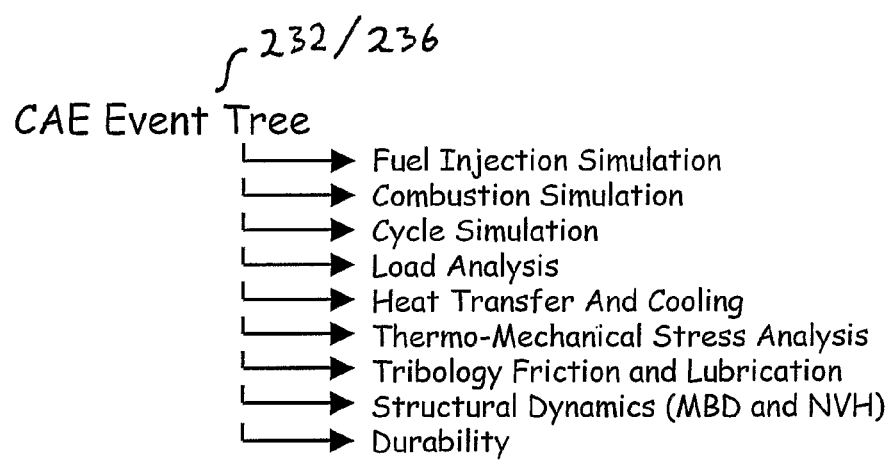

FIG. 17(e) shows a typical CAE event tree 232, 236 for either the analysis template 224 or the results template 226.

Figure 18C:
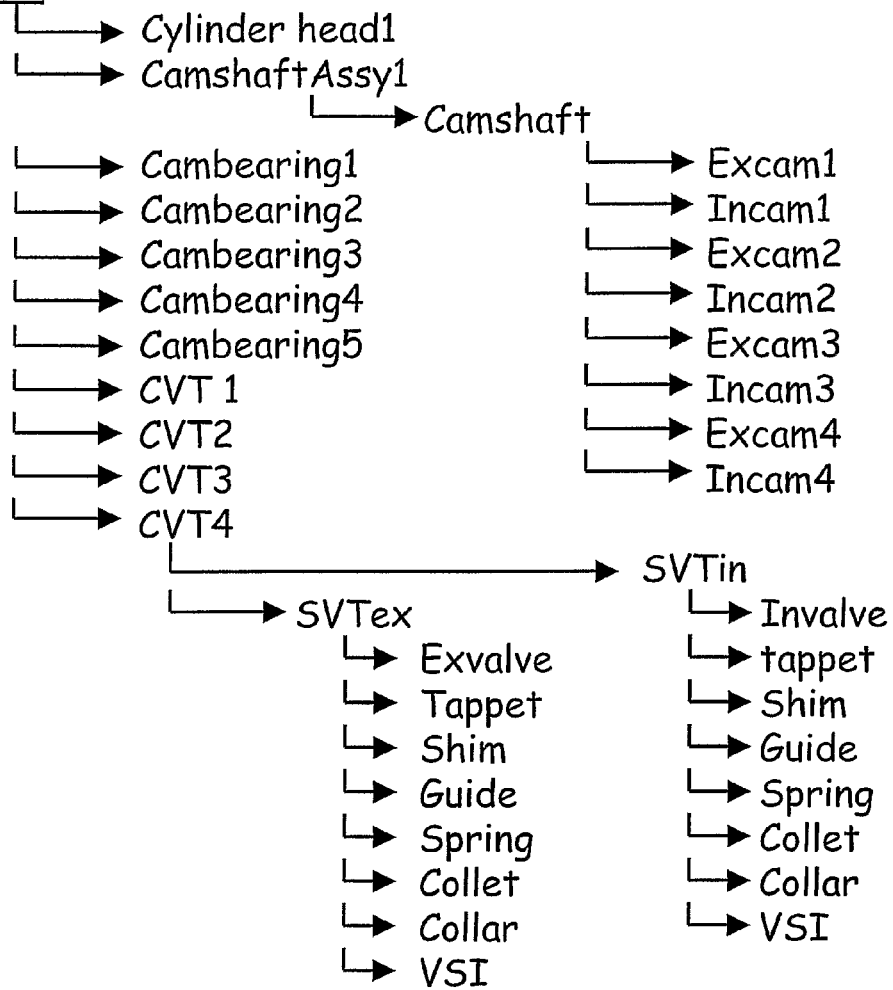
Figure 18D:
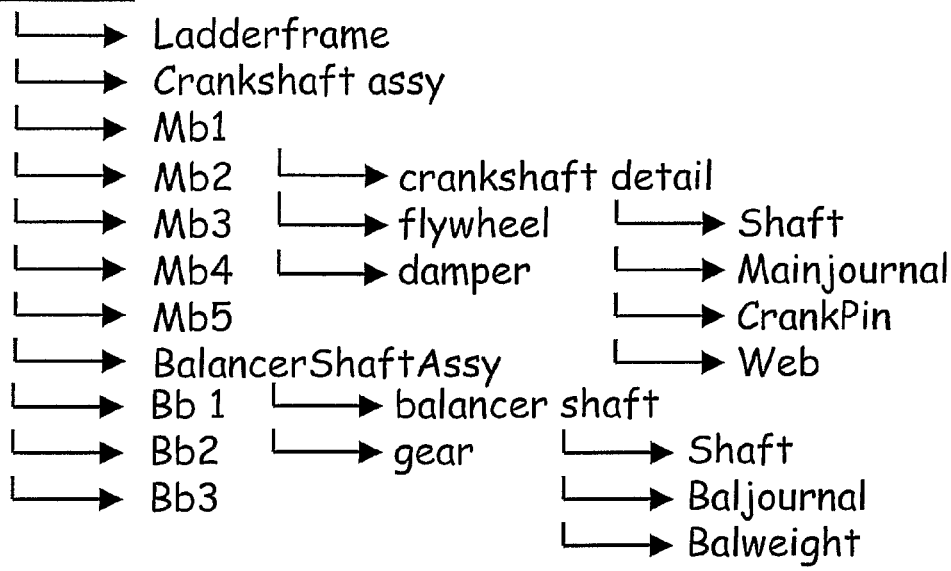
Figure 18E:
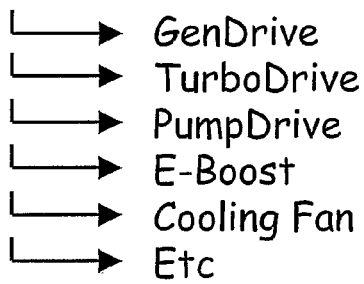

FIGS. 18(a) to 18(f) show various portions of a typical object tree for an engine system. Referring to FIG. 18(a), a main system object assembly (EngDrive) is expanded to show its sub-system object assemblies (CamDrive, CylDrive, CrankDrive, LubeDrive, AuxDrive).

In FIG. 18(b) the CylDrive sub-system object tree is partially expanded to show a plurality of block, liner, and cylinder objects, at a first level. One of the cylinder objects (Powercyle) is further expanded to show a number of the objects from which it has been assembled, including piston, pin, top ring, second ring, oil ring and conrod objects. Similarly, the conrod object has been further expanded to show its component objects including small end bearing, big end bearing, and left/right hand side bolt objects.

Similar expansions, are shown for the CamDrive, CrankDrive, AuxDrive and LubeDrive sub-systems in FIGS. 18(c), (d), (e) and (f) respectively, the content of which will be readily understandable to a skilled addressee and which will not be described in further detail.

It will be appreciated that the engine designer framework described with reference to FIGS. 16 to 18(f) is purely an example of the type of system that may be simulated using a simulation environment according to the invention. FIG. 19(a), for example, shows a schematic block diagram of a generic system designer framework generally at 230. The framework is generally similar to that of the engine designer framework and will not be described again in detail.

The generic system designer framework 250 comprises a main system object assembly 252 (SystemDrive), and a plurality of sub-system object assemblies 254, 256, 258 (SubSystemDrive (a), (b), . . . (n).) In the case of the engine designer framework 200 'EngDrive' is equivalent to 'SystemDrive' and 'CamDrive', 'CylDrive', 'CrankDrive', 'LubeDrive' and 'AuxDrive' are each equivalent to one of the 'SubSystemDrives'. However, in a vehicle designer framework the main system object assembly will represent an entire vehicle, whilst 'EngDrive' will represent just one of the sub-systems. Other sub-systems represented may include, for example, generator, transmission, turbo, chassis, and brake sub-systems.

Similarly, the simulation environment may be adapted for the simulation of 'super-systems' representing, for example, a plurality of systems of different types such as motor vehicles, aircraft, buildings, highways etc. FIG. 19(b), for example, shows a schematic block diagram of a generic super-system designer framework generally at 270. The framework is generally similar to that of the engine designer and system designer frameworks and will not be described again in detail. Super-system simulation may include, for example, analysis events for assessing environmental climate effects, seasonal influences and the effects of terrain or sea in the plurality of systems.

Figure 20B:
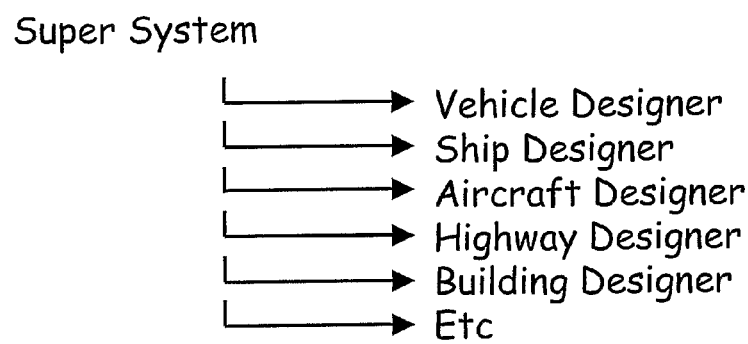

In FIG. 20(a) an expanded portion of an object tree for a generic super-system is shown. FIG. 20(b) shows an expanded portion of a super-system object tree illustrating the types of system that might make up a super system object assembly, including a vehicle system designer.

FIG. 20(c) illustrates an expanded portion of an object tree for a vehicle system which may form part of the super-system or which may, alternatively, be an independently simulated system. In addition to an engine system, an example of which has already been described in detail, the vehicle system includes a generator system, a turbo system, a transmission system, a chassis system, and a brake system.

FIG. 20(e) shows an expanded portion of an object tree for the generator system part of the vehicle system object tree, and FIGS. 20(e) to (h) each show expanded portions of object trees for each of the sub-systems making up the generator system.

Thus, the simulation environment allows models representing systems of extreme complexity to be built up from a relatively few basic generic building blocks in the form of finite objects, simulated and analysed. The finite objects carry the mesh data required for the derivation of the component object mesh, and hence, once built the assembled systems may be simulated substantially immediately without the need for weeks or even months of unpredictable mesh generation. Furthermore, the quality of the mesh automatically built into more complex object assemblies is high, because the mesh is initially built into simple geometric objects for which mesh construction is relatively simple.

The invention claimed is:

1. A method of simulating an environment for the simulation of a physical system or sub-system, the method comprising:
creating a plurality of individually geometrically defined two dimensional or three dimensional finite objects each of which have, geometric definition data, and, separate from the geometric definition data, associated mesh data, wherein said geometric definition data comprises geometrical attributes required for creating the geometric representation of the finite object, and said mesh data comprises data required for creating the representation of a mesh of said finite object;
arranging a plurality of finite objects to form any of a plurality of component object models or sub-component object models, said component or sub-component object models assemblable to form a model of at least one assembly object comprising at least part of said system or sub-system; wherein:
the geometric definition data of each finite object is re-definable;
the mesh data associated with each finite object is re-definable;
each said finite object is provided with rules of connectivity, said rules of connectivity governing the interconnection of said finite object to form said component or sub-component objects;
and wherein when said plurality of finite objects are arranged from a completed component or sub-component object, said mesh data for a particular finite object is automatically incorporated into each completed component or sub-component object including said particular finite object, and further,
wherein amendments to the size of finite objects within components are made without re-meshing the whole component.

2. The method as claimed in claim 1, wherein said mesh incorporated into said component or sub-component is continuous.

3. The method as claimed in claim 1 or 2, wherein said mesh incorporated into said component or sub-component is an attribute or part of the component or sub-component object, or the at least one assembly object.

4. The method as claimed in claim 1, or claim 2 wherein the finite objects comprise both two-dimensional and three-dimensional finite objects.

5. The method as claimed in claim 4 wherein the geometric definition of each of at least some of the three-dimensional finite objects are formed from a transformation applied to an associated two-dimensional finite object.

6. The method as claimed in claim 1 or claim 2 wherein the finite objects further comprise tribological elements for friction and/or lubrication analysis.

7. The method as claimed in claim 1 or claim 2 wherein each component or sub-component is provided with geometric attributes defining geometric properties of said component or sub-component.

8. The method as claimed in claim 1 or claim 2 wherein each component or sub-component is provided with physical or material attributes defining physical or material properties of said component or sub-component.

9. The method as claimed in claim 1, wherein modification of the geometric data automatically results in an associated change to the mesh data.

10. The method as claimed in claim 1 or claim 2 wherein said rules of connectivity apply to specific sides/surfaces of said finite objects and wherein internal connections between the component or sub-component objects, at said sides/surfaces, are configured to allow geometric and object information to be passed from one component, and hence finite object, to another and hence allow changes to the geometry and material attributes of an object and or changes to the finite objects within the mesh to be automatically propagated throughout the assembled object.

11. The method as claimed in claim 1 or claim 2 wherein said rules of connectivity apply to specific sides/surfaces of said finite objects and wherein connections between the finite objects, at the said sides/surfaces, are configured to allow mesh information to be passed from one finite object to another and hence allow changes to the mesh data propagate automatically through the finite objects as the components are assembled.

12. The method as claimed in claim 1 or claim 2 wherein internal connections between the component or sub-component objects, at the connectivity sides/surfaces, are configured to allow mesh information to be passed from one component, and hence finite object, to another and hence allow the mesh data to automatically propagate through the model as the components are assembled.

13. The method as claimed in claim 1 wherein the finite object is a two dimensional shape and the geometric definition of said finite object comprises a geometric definition of said shape.

14. The method as claimed in claim 1 wherein the finite object is a two dimensional shape and the geometric definition of said two dimensional shape comprises a number of sides defining the basic shape of the finite object.

15. The method as claimed in claim 1 wherein the finite object is a three dimensional solid and the geometric definition of said three dimensional solid comprises a number surfaces defining the basic shape of the finite object.

16. The method of any one of claims 1, 2, 9, 13, 14 or 15 wherein the method is controlled by a computer program.

\* \* \* \* \*